US010468755B2

(12) United States Patent
Williams

(10) Patent No.: US 10,468,755 B2
(45) Date of Patent: Nov. 5, 2019

(54) DATA COMMUNICATIONS SYSTEM FOR A VEHICLE

(71) Applicant: Plum Laboratories, LLC, Springfield, TN (US)

(72) Inventor: Dawson Lee Williams, Springfield, TN (US)

(73) Assignee: Plum Laboratories, LLC, Springfield, TN (US)

( * ) Notice: Subject to any disclaimer, the term of this patent is extended or adjusted under 35 U.S.C. 154(b) by 0 days.

(21) Appl. No.: 15/873,836

(22) Filed: Jan. 17, 2018

(65) Prior Publication Data
US 2019/0044217 A1 Feb. 7, 2019

Related U.S. Application Data

(63) Continuation-in-part of application No. 15/587,167, filed on May 4, 2017, now Pat. No. 10,003,124.
(Continued)

(51) Int. Cl.
*H01Q 1/24* (2006.01)
*H01Q 1/22* (2006.01)
(Continued)

(52) U.S. Cl.
CPC .......... *H01Q 1/243* (2013.01); *H01Q 1/1207* (2013.01); *H01Q 1/1221* (2013.01);
(Continued)

(58) Field of Classification Search
CPC .... H01Q 1/243; H01Q 1/1207; H01Q 1/2291; H01Q 21/28; H04B 1/38; H05K 5/0221;
(Continued)

(56) References Cited

U.S. PATENT DOCUMENTS 5,055,793 A 10/1991 Mulcahey
5,461,880 A 10/1995 Bolton et al.
(Continued)

FOREIGN PATENT DOCUMENTS

EP 2551151 A1 * 1/2013 ............ B60P 3/1025
JP 2008107888 A 5/2008

OTHER PUBLICATIONS

International Search Report dated Apr. 5, 2017 in corresponding PCT Patent Application No. PCT/US2016/066675.
(Continued)

*Primary Examiner* — Dameon E Levi
*Assistant Examiner* — David E Lotter
(74) *Attorney, Agent, or Firm* — Waller Lansden Dortch & Davis, LLP; Blake M. Bernard

(57) ABSTRACT

A data communications system is disclosed for a vehicle having an exterior surface and an interior space, the data communications system including a support frame positionable within the interior space of the vehicle. A case is movable between an open and a closed position and includes a mounting system, the case mountable to the exterior surface of the vehicle via the mounting system. The system includes a power supply and a router device communicated with the power supply, one or more of the power supply and the router device mounted to the support frame. An antenna array is mounted within the case, the antenna array communicated with the router device, the antenna array including at least two cellular antennas.

16 Claims, 22 Drawing Sheets

Related U.S. Application Data which is a continuation of application No. 15/379,219, filed on Dec. 14, 2016, now Pat. No. 9,680,208.

(60) Provisional application No. 62/304,905, filed on Mar. 7, 2016, provisional application No. 62/395,394, filed on Sep. 16, 2016, provisional application No. 62/447,374, filed on Jan. 17, 2017.

(51) Int. Cl.
| | | |
|---|---|---|
| *H01Q 21/28* | (2006.01) | |
| *H04B 1/38* | (2015.01) | |
| *H05K 7/12* | (2006.01) | |
| *H01Q 1/12* | (2006.01) | |
| *H05K 5/02* | (2006.01) | |
| *H05K 7/18* | (2006.01) | |
| *H01Q 1/32* | (2006.01) | |
| *H01Q 1/42* | (2006.01) | |

(52) U.S. Cl.
CPC ............ *H01Q 1/2291* (2013.01); *H01Q 1/24* (2013.01); *H01Q 1/3275* (2013.01); *H01Q 21/28* (2013.01); *H04B 1/38* (2013.01); *H05K 5/023* (2013.01); *H05K 5/0221* (2013.01); *H05K 5/0239* (2013.01); *H05K 5/0247* (2013.01); *H05K 7/12* (2013.01); *H05K 7/186* (2013.01); *H01Q 1/42* (2013.01)

(58) Field of Classification Search
CPC .... H05K 5/023; H05K 5/0239; H05K 5/0247; H05K 7/12; H05K 7/186
See application file for complete search history.

(56) References Cited

U.S. PATENT DOCUMENTS

| | | |
|---|---|---|
| 6,015,072 A | 1/2000 | Young |
| 6,422,669 B1 | 7/2002 | Salvatori et al. |
| 7,421,265 B1 | 9/2008 | Liu |
| 2009/0038901 A1 | 2/2009 | Pomerantz |
| 2009/0140020 A1 | 6/2009 | Schlipper |
| 2010/0197222 A1 | 8/2010 | Scheucher |
| 2010/0234071 A1* | 9/2010 | Shabtay ............... H04B 7/0408 455/562.1 |
| 2011/0011760 A1 | 1/2011 | Habersetzer |
| 2011/0215985 A1* | 9/2011 | Kaplan .................. H01Q 21/08 343/879 |
| 2011/0267222 A1* | 11/2011 | Craig .................... G01S 13/878 342/25 B |
| 2011/0279337 A1 | 11/2011 | Corwin et al. |
| 2012/0235635 A1 | 9/2012 | Sato |
| 2013/0105354 A1 | 5/2013 | Wyner et al. |
| 2013/0109449 A1 | 5/2013 | Desclos et al. |
| 2014/0217862 A1 | 8/2014 | Rayner |
| 2014/0304921 A1 | 10/2014 | Collins et al. |
| 2014/0329458 A1 | 11/2014 | Charette et al. |
| 2015/0173472 A1 | 6/2015 | Gierke et al. |
| 2015/0201723 A1 | 7/2015 | Rayner et al. |
| 2016/0272774 A1 | 9/2016 | Snider et al. |
| 2017/0024537 A1 | 1/2017 | Ferlito |
| 2017/0187107 A1 | 6/2017 | Charette |
| 2018/0020793 A1 | 1/2018 | Rao et al. |

OTHER PUBLICATIONS

Written Opinion dated Apr. 5, 2017 in corresponding PCT Patent Application No. PCT/US2016/066675.

* cited by examiner

DATA COMMUNICATIONS SYSTEM FOR A VEHICLE

CROSS-REFERENCES TO RELATED APPLICATIONS

This application is a continuation in part application of U.S. patent application Ser. No. 15/587,167 filed on May 4, 2017, entitled DATA COMMUNICATIONS CASE HAVING AN INTERNAL ANTENNA ARRAY, which is a continuation of and claims the benefit of and priority to U.S. patent application Ser. No. 15/379,219 filed on Dec. 14, 2016 (now U.S. Pat. No. 9,680,208), entitled DATA COMMUNICATIONS CASE HAVING AN INTERNAL ANTENNA ARRAY, which claims priority to U.S. Provisional Patent Application Ser. No. 62/304,905 filed Mar. 7, 2016 entitled DATA COMMUNICATIONS CASE HAVING AN INTERNAL ANTENNA ARRAY and U.S. Provisional Patent Application Ser. No. 62/395,394 filed Sep. 16, 2016 entitled DATA COMMUNICATIONS CASE HAVING AN INTERNAL ANTENNA ARRAY, and also claims priority to U.S. Provisional Patent Application Ser. No. 62/447,374 filed Jan. 17, 2017, entitled DATA COMMUNICATIONS CASE HAVING AN INTERNAL ANTENNA ARRAY, each of the above noted applications being incorporated herein by reference in their entireties.

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

STATEMENT REGARDING FEDERALLY SPONSORED RESEARCH OR DEVELOPMENT

Not Applicable

REFERENCE TO SEQUENCE LISTING OR COMPUTER PROGRAM LISTING APPENDIX

Not Applicable

BACKGROUND OF THE INVENTION

This present disclosure generally relates to the field of data communications.

More specifically, the present disclosure relates to facilitating various types of communications, including secure, high-speed data communications, and voice communications when current end user devices may detect that little or no wireless or voice signal is available. Network failures and slow data communications occur for a myriad of reasons—from crowded networks to natural disasters—leading to frustrations in a society that is growing ever dependent on the ability to transmit and receive communications, including secure, high-speed data. Further, obtaining data and voice communication in remote areas without readily available power supplies, internet connectivity, and/or where cellular coverage is weak or non-existent can be difficult if not impossible, which can be especially undesirable for public safety officials and others that often rely on data and voice communications for work projects in rural environments and in disaster relief situations.

Conventional data communication units are large, bulky, and difficult to transport, and thus are typically retained in a generally fixed or permanent location. Additionally, conventional, portable antennas are typically located on the outside of a data communications unit, creating a cumbersome device that is not aesthetically pleasing, where the antennas are freely exposed to external wear, tear and breakage.

What is needed then are improvements to data communication units.

BRIEF SUMMARY

This Brief Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

One aspect of the present disclosure is a data communications system for a vehicle having an exterior surface and an interior space, the data communications system including a support frame positionable within the interior space of the vehicle. A case is movable between an open and a closed position and includes a mounting system, the case mountable to the exterior surface of the vehicle via the mounting system. The system includes a power supply and a router device communicated with the power supply, one or more of the power supply and the router device mounted to the support frame. An antenna array is mounted within the case, the antenna array communicated with the router device, the antenna array including at least two cellular antennas.

In some embodiments, the router device and the power supply can be positioned on the support frame. In some embodiments, at least one wireless antenna can also be mounted to the support frame and electrically communicated with the router device. In some embodiments, the mounting system can include at least one case rail mounted to the case and at least one vehicle rail mountable to the vehicle, the case rail and the vehicle rail securable together to mount the case to the vehicle.

The data communications system of the present disclosure can be utilized in one application in various vertical markets for failover when there is a power outage or the Wide Area Network (WAN) is down. The data communications system of the present disclosure can also be used in areas where cellular coverage may appear to be weak or even non-existent in order to amplify or increase the wireless or voice signal detected by an end user device, such as a phone, tablet, or laptop. The data communications system of the present disclosure may also be deployed for events, such as sales meetings, sporting, entertainment or news events, etc. The data communications system of the present disclosure can also be used for military, police, fire, rescue, or other combat and/or emergency vehicles.

One objective of the present disclosure is to provide a portable data and voice communications system for a vehicle that allows for reliable wireless and cellular communications and/or GPS location services when power outages or signal disruptions occur.

Another objective of the present disclosure is to provide a portable, data and voice communications system for a vehicle that allows for reliable wireless and cellular communications and/or GPS location services in areas where signal strength is weak or nonexistent.

Another objective of the present disclosure is to allow for greater mobility and durability for portable data and voice communications systems. In conventional portable data and voice communications systems, antennas have not been housed inside protective carrying cases and thus have not been capable of withstanding significant impact.

Numerous other objects, advantages, and features of the present disclosure will be readily apparent to those of skill in the art upon a review of the following description of certain embodiments, including the drawings and figures attached hereto.

DETAILED DESCRIPTION

Figure 1:
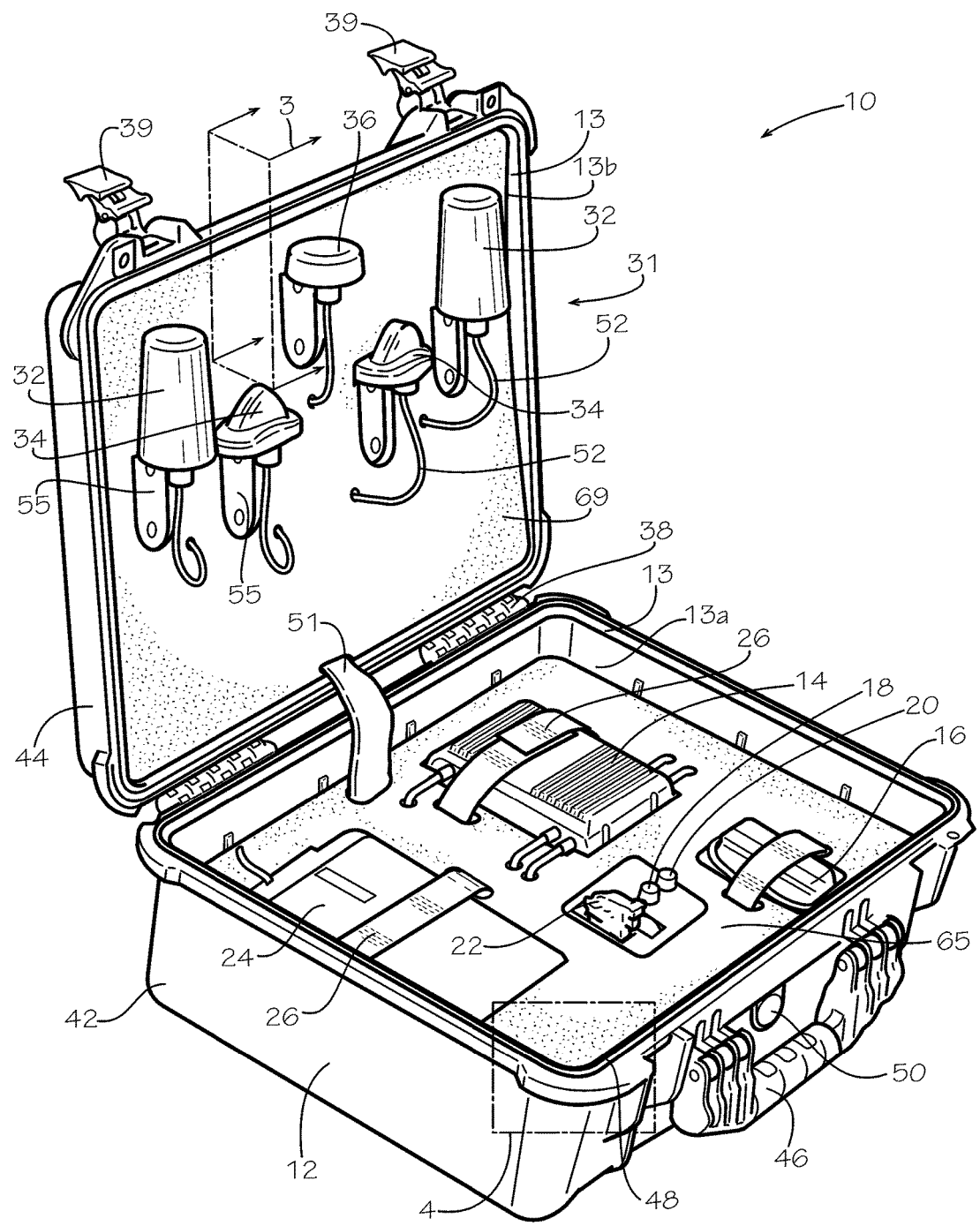
FIG. 1 is a perspective view of an embodiment of a data communications apparatus of the present disclosure with a lid of the apparatus in an open position to provide access to internal components of the apparatus.

While the making and using of various embodiments of the present invention are discussed in detail below, it should be appreciated that the present invention provides many applicable inventive concepts that are embodied in a wide variety of specific contexts. The specific embodiments discussed herein are merely illustrative of specific ways to make and use the invention and do not delimit the scope of the invention. Those of ordinary skill in the art will recognize numerous equivalents to the specific apparatus and methods described herein. Such equivalents are considered to be within the scope of this invention and are covered by the claims.

In the drawings, not all reference numbers are included in each drawing, for the sake of clarity. Positional terms used herein such as "upper," "lower," "side," "top," "bottom," etc. refer to the apparatus when in the orientation shown in the drawing that is being referred to in the accompanying description. A person of skill in the art will recognize that the apparatus can assume different orientations when in use.

Figure 2:
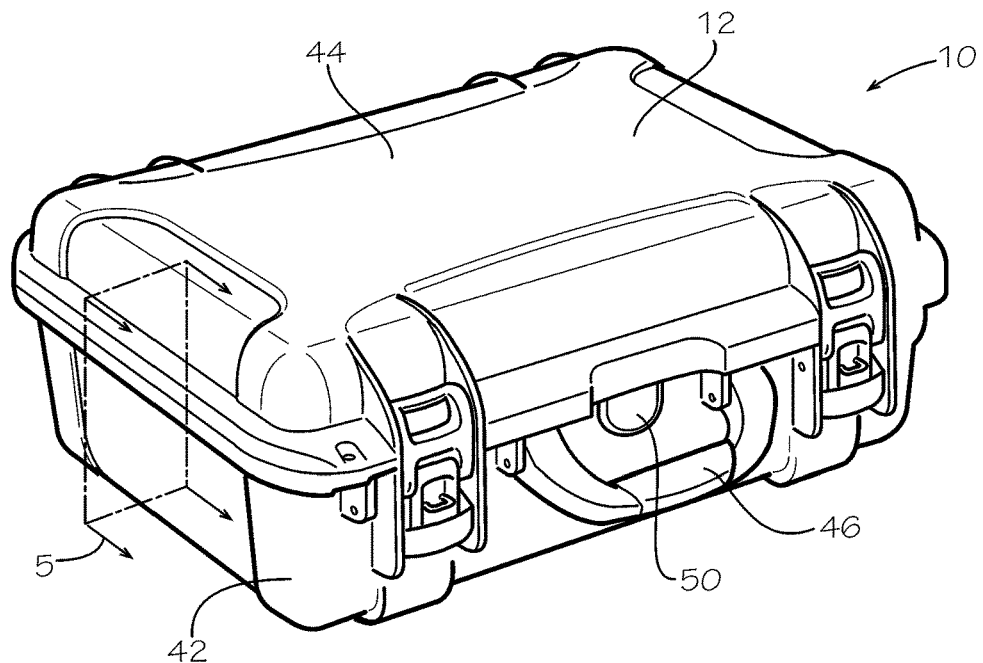
FIG. 2 is a perspective view of the data communications apparatus of FIG. 1 with the lid in the closed position.

An embodiment of the data communications apparatus 10 containing various components is shown in FIG. 1. Apparatus 10 can include a case 12 including a base 42 and a lid 44 connectable to base 42. Lid 44 can be movable with respect to base 42 between an open position and a closed position. In FIG. 1, lid 44 is shown pivotally connected to base 42 via hinge 38, such that lid 44 can rotate with respect to base 42 between an open and a closed position. One or more latches or clasps 39 can secure lid 44 to base 42 when lid 44 is in the closed positon, as shown in FIG. 2. In other embodiments, lid 44 can be detachable from base 42 such that lid 44 can be connectable on base 42 and secured thereto via two or more latches or clasps 39 positioned around the periphery of case 12. Moving lid 44 from a closed position, as shown in FIG. 2, to an open position, as shown in FIG. 1, can provide a user access to the internal components of case 12. Case 12 can include a handle 46 which can be grasped by a user to facilitate carrying apparatus 10 and case 12.

Figure 3:
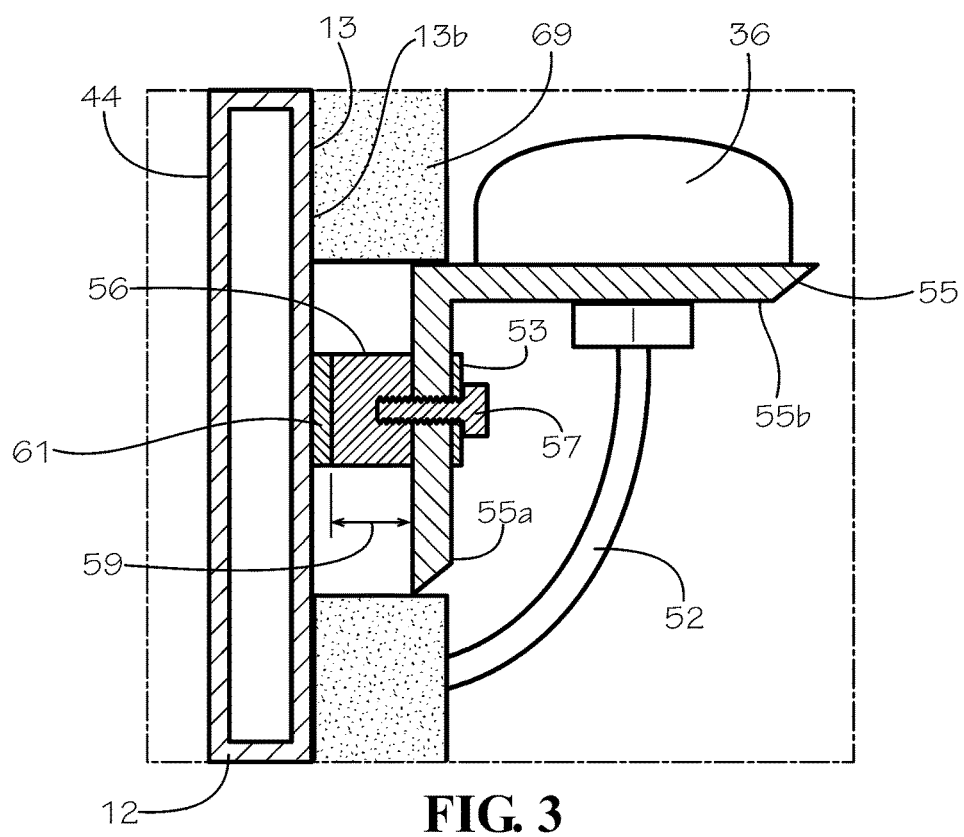
FIG. 3 is a detailed cross section view of another embodiment of a data communications case of the present disclosure having hollow case sidewalls, the apparatus having an antenna mounted to a mounting bracket and the mounting bracket adhered to an inner side of a lid of the apparatus.
Figure 5:
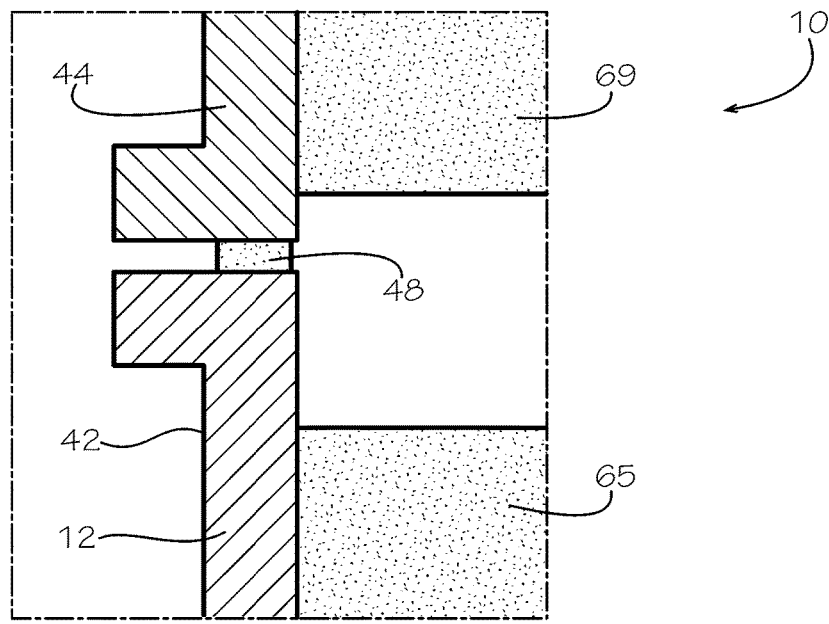
FIG. 5 is a cross section view of the apparatus of FIG. 2 showing the annular gasket compressed between the lid and the base of the apparatus.
Figure 6:
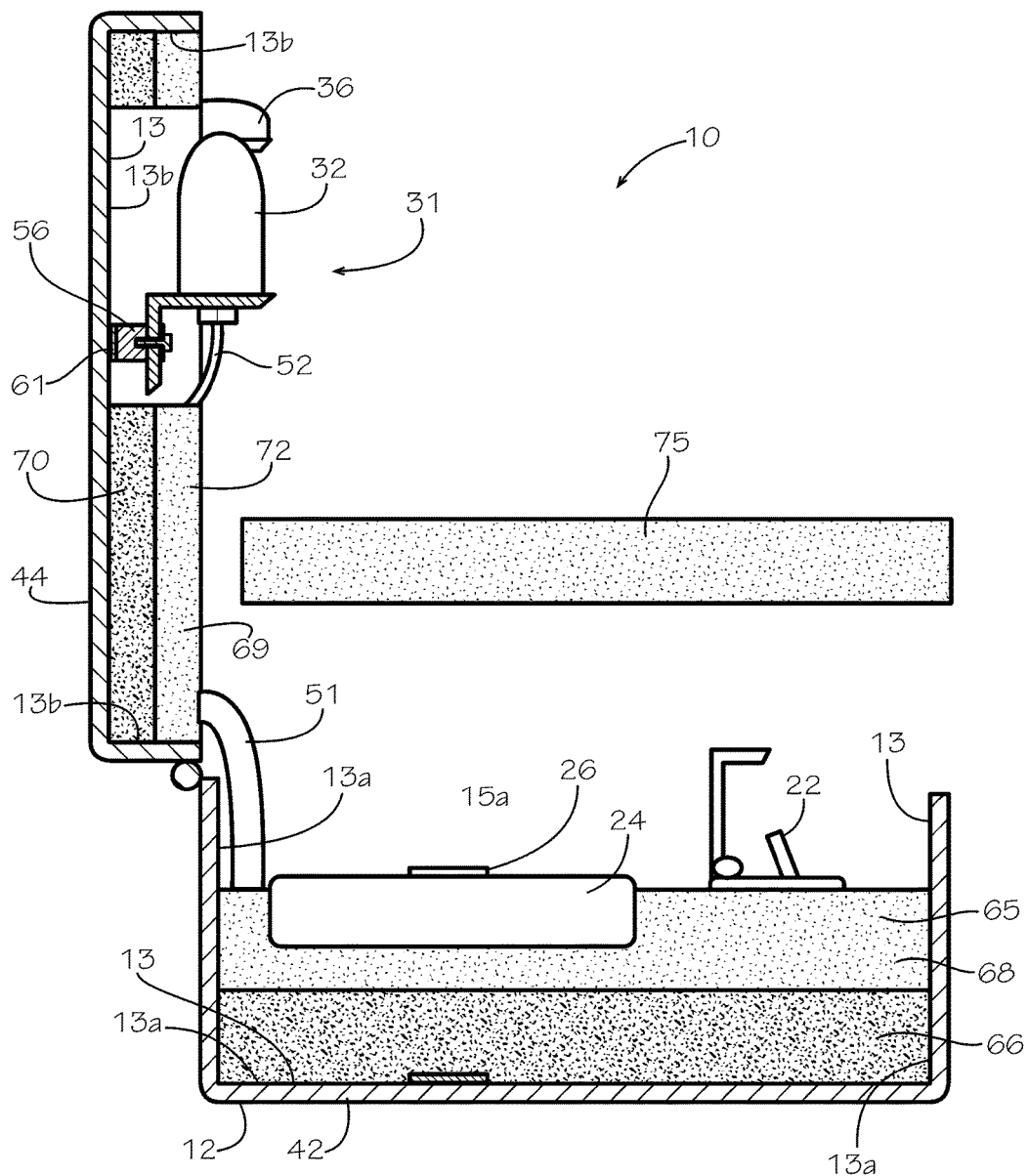
FIG. 6 is a cross section view of the apparatus of FIG. 1 with the lid of the apparatus in an open position.

In some embodiments, the sidewalls of case 12 can be a hollow structure having an inner and an outer shell as shown in FIG. 3. The outer and inner shells of case 12 can be made from any suitable material, including but not limited to polypropylene, which can help provide impact resistance, waterproofing, crush-proofing, and dustproofing characteristics to case 12. The outer and inner shells of case 12 may also comprise various other polymers including polyethylene, high-density polyethylene, polyurethane, polyester, nylon, silicone rubber, polycarbonates, and various other polymers known in the art. In some embodiments, case 12 can be a solid structure having a single, thicker shell, as shown in FIGS. 5-6. As shown in FIG. 6, case 12 can include an inner surface 13, which can include base inner surface 13a and lid inner surface 13b. Base inner surface 13a can define a base cavity 15a, and lid inner surface 13b can define a lid cavity 15b. Components contained within case 12 can be positioned in either base cavity 15a or lid cavity 15b.

Figure 4:
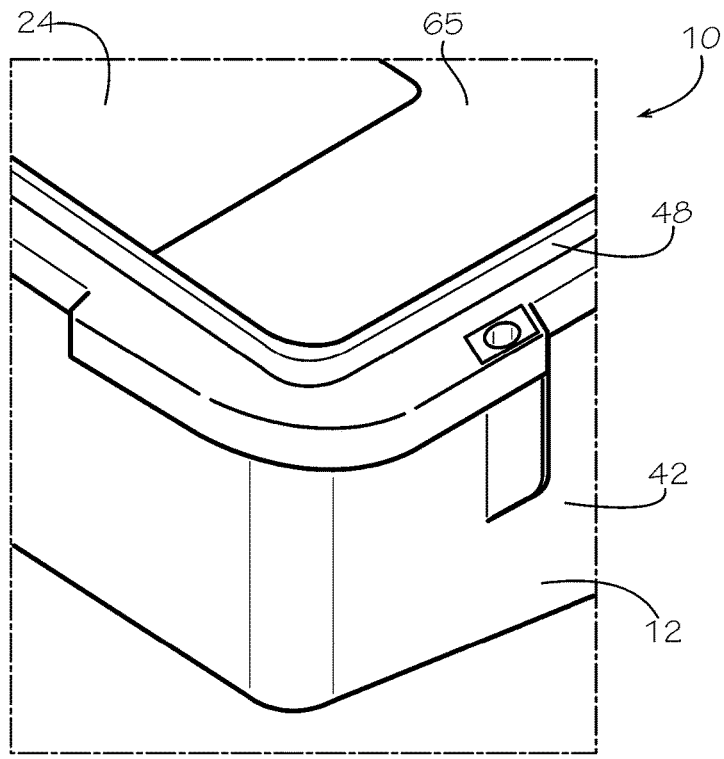
FIG. 4 is a detailed perspective view of the apparatus of FIG. 1 showing an annular gasket positioned on a base of the apparatus.

In some embodiments, apparatus 10 can include an annular gasket 48 positioned on case 42, shown in FIGS. 1 and 4-5. When lid 44 is in the closed position, annular gasket 48 may be compressed between lid 44 and base 42 to form an annular seal between base 42 and lid 44. The annular seal formed by annular gasket 48 can be a waterproof seal such that when lid 44 is in a closed position, annular gasket 48 can help protect the internal components of apparatus 10 from exposure to liquids, as well as dust and other potential contaminants. Annular gasket 48 can be made from a rubber or elastomer material, or any other suitable material for forming a seal between base 42 and lid 44. Annular gasket 48 can help ensure that pressure equalization within case 12 is maintained. In some embodiments, case 12 may include an automatic-pressure release valve 50. As apparatus 10 is operated, heat can be generated inside case 12 which can increase the pressure inside case 12. Pressure relief valve 50 can be configured to sense or determine the pressure inside case 12, and automatically open to release pressure within case 12 when the pressure exceeds a predetermined threshold.

In certain embodiments, case 12 meets or exceeds U.S. military specifications for ruggedized equipment. For the embodiment shown in FIG. 1, the interior dimensions of case 12 are approximately 18.0-20.0 inches in length by 12.0-14.0 inches in width by 6.0 to 8.0 inches in height; and the exterior dimensions of case 12 are approximately 19.0-21.0 inches in length by 15.0-17.0 inches in width by 7.0-9.0 inches in height. For the embodiment shown in FIG. 1, the weight of case 12 when empty is approximately six to eight pounds. The size and weight of case 12 can be varied in different applications to increase or decrease the size and weight of case 12 and apparatus 10 as desired for different uses and to accommodate varying numbers of internal components as necessary. A case designed to be easily portable and easy to transport can be beneficial in various situations and applications, for instance when used by emergency responders and other public safety officials who can conveniently transport apparatus 10 to disaster relief areas or other remote areas without power, wireless service, and/or voice service. The size and weight of case 12 and apparatus 10 can also be varied for business and sales persons that may travel frequently and desire to have ready access to data and voice communications capabilities.

Referring again to FIGS. 1 and 6, apparatus 10 can include a router device 14 secured within case 12, and a rechargeable wireless power supply 24 secured within case 12. Router device 14 can selectively receive power from power supply 24. Apparatus 10 can include an AC/DC adapter 16. Power supply 24 can be connected to adapter 16 and adapter 16 can be plugged into an external power grid in order to recharge power supply 24 between uses of apparatus 10, or while apparatus 10 is being used and power supply 24 is depleted. In some embodiments, apparatus 10 can include a second power source which can be a second standalone power source such as a battery or load cell which can be connected to power source 24. A second standalone power source can help prolong the usable life of apparatus 10 when apparatus 10 is used in remote area or areas without access to a utility power grid. In some embodiments, the second standalone power source can be configured to provide multiple days of additional power to apparatus 10. In some embodiments, the second external power source can be contained in its own, waterproof protective case such that the second standalone power source is protected as described herein. Case 12 and the case for the second standalone power source can be positioned side by side or on top of one another and the secondary power source can be connected to power source 24.

A power switch 22, a main fuse 18, and an auxiliary fuse 20 can also be secured within case 12. Power switch 22 can be in electrical communication with power supply 24 and router device 14 and can be selectively toggled by a user to turn on apparatus 10 and supply power from power supply 24 to router device 14. Main fuse 18 and auxiliary fuse 20 can be utilized to power additional electrical devices if desired, for instance external lighting sources, which can be beneficial in times of power outages or in remote locations away from electrical power grids. Power supply 24, router device 14, power switch 22, main fuse 18 and auxiliary fuse 20 can be connected to one another by low voltage (approximately 9V to 36V) electrical wiring that is coated with a suitable insulating material (e.g., flame-retardant polyvinyl chloride), having an approximate thickness of 0.007-0.011 inches. An insulated coating on the electrical wiring can help reduce electromagnetic interference between the wiring, as well as with other electrical components of apparatus 10.

In certain embodiments, router device 14 comprises a built-in modem, a cellular gateway, WAN/LAN switchable ports, and a wireless network adapter. In certain embodiments, router device 14 is capable of utilizing a firewall to block unauthorized access to communications sent and/or received via router device 14. In certain embodiments, router device 14 is capable of enabling multiple, segmented wireless networks, which can either be public or private wireless networks. The multiple wireless networks may have separate and different service set identifiers (SSIDs), each of which may be defined with passcodes. It is advantageous that router device 14 be capable of encrypting data communications via various encryption protocols (e.g., encrypting WiFi communications with WEP, WPA, WPA2, etc.). It may also be advantageous that router device 14 be programmable to allow for load balancing.

Further, each wireless network may be capable of having multiple users. In some embodiments, each wireless network and SSID can simultaneously accommodate multiple users. In some embodiments, router device 14 can enable multiple separate wireless networks and SSIDs, such that apparatus 10 can accommodate additional users on the separate wireless networks. Router device 14 may utilize either static or dynamic IP addressing schemas. In certain embodiments, router device 14 may enable 802.11 wireless connectivity utilizing distinct wireless frequencies (e.g., 2.4 GHz, 3.6 GHz, 4.9 GHz, 5 GHz, or 5.9 GHz). In certain embodiments, router device 14 may enable 802.11 wireless connectivity in a, b, g, n, and/or ac standard configurations. In certain embodiments, router device 14 may be programmed via a cloud based device manager. In certain embodiments, router device 14 can include multiple cellular gateways such that router device 14 may accommodate and communicate with more than one cellular carrier.

Figure 7:
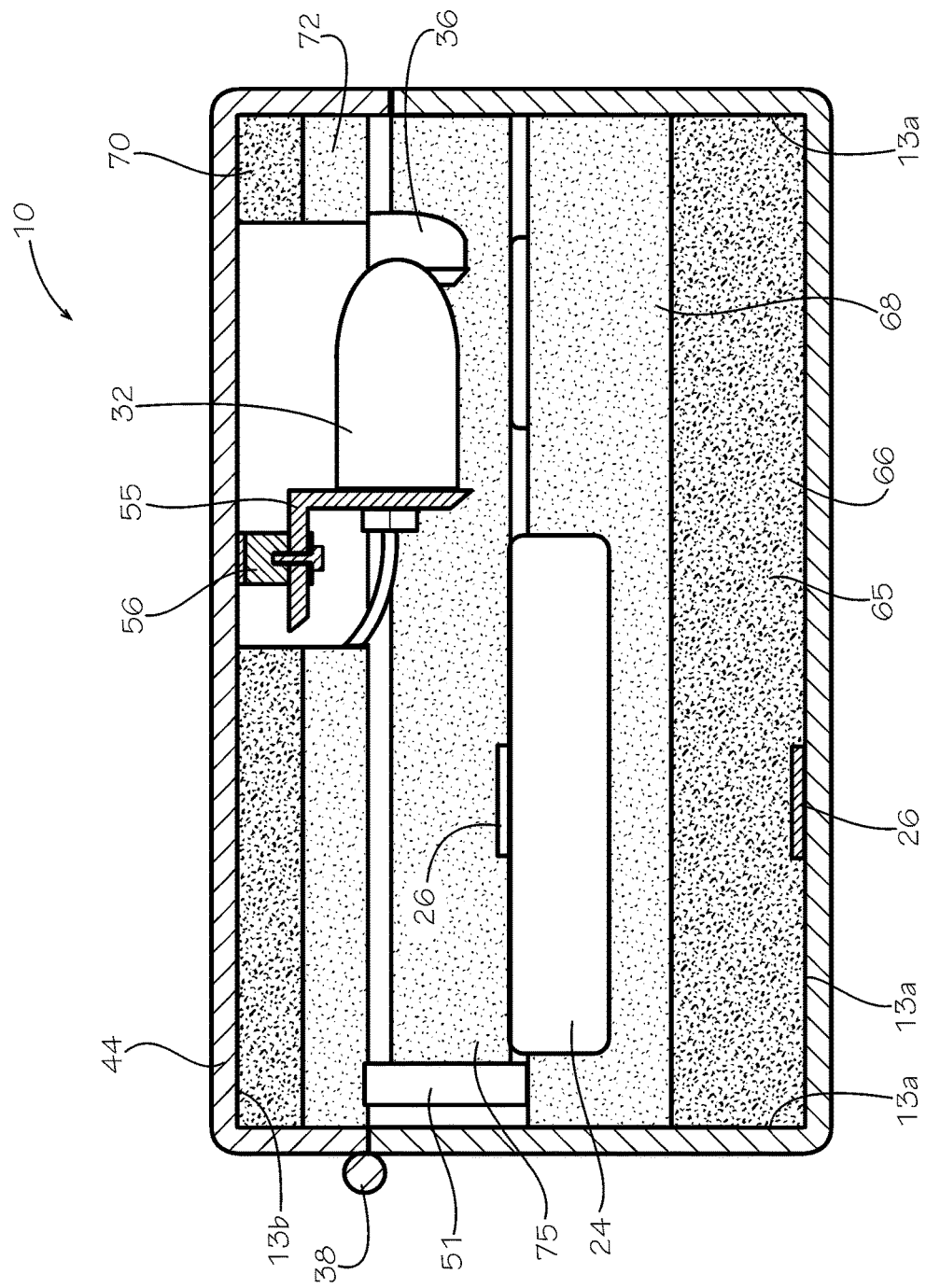
FIG. 7 is a cross section view of the apparatus of FIG. 6 with the lid of the apparatus in a closed position.
Figure 12:
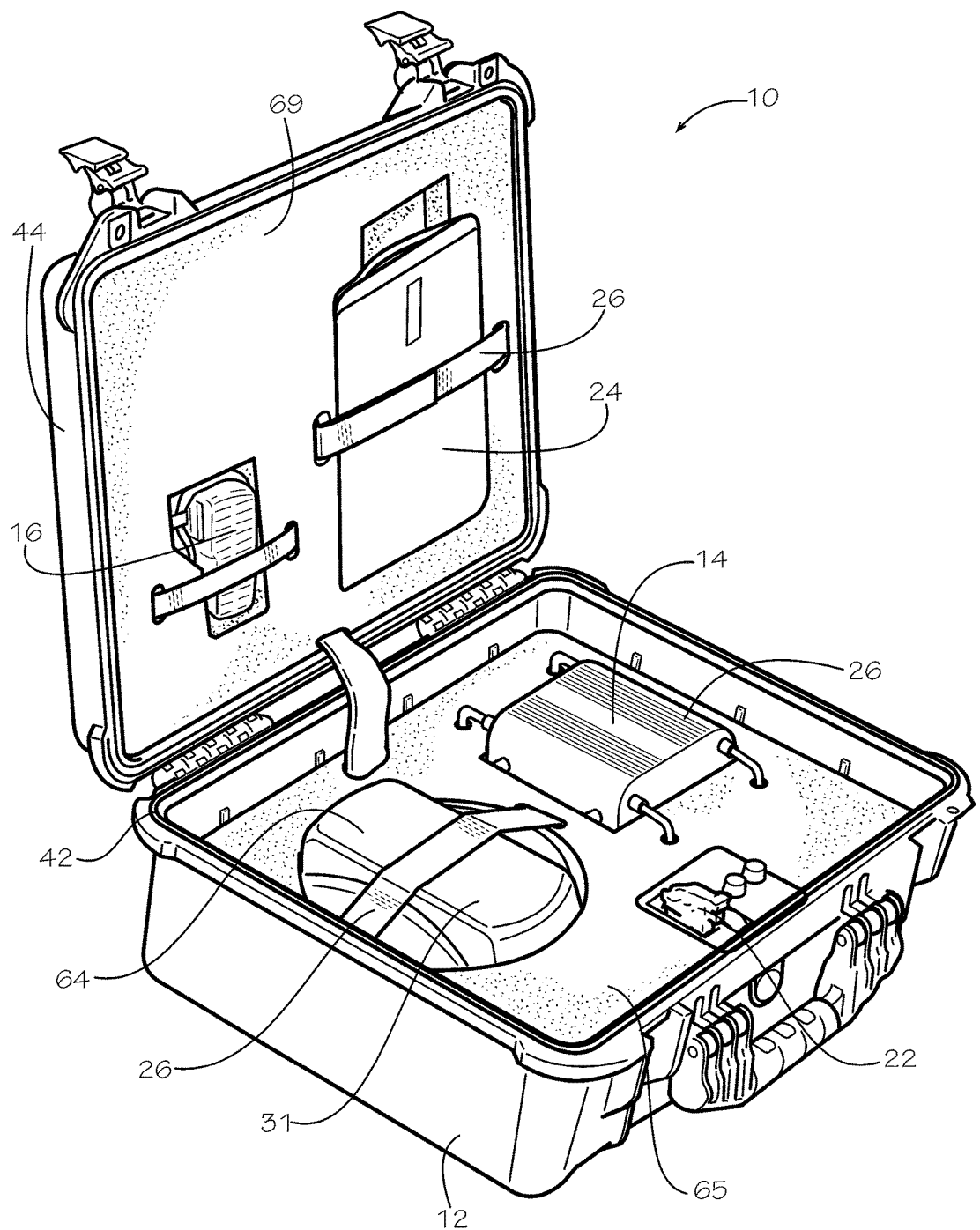
FIG. 12 is a perspective view of another embodiment of a data communications apparatus of the present disclosure having an antenna array with multiple antennas contained within an antenna housing.

In certain embodiments, router device 14 may have multiple WAN/LAN/RJ-45 ports for failover if a user wishes to directly connect to router device 14. In certain embodiments, router device 14 may comprise a Gobi® radio An antenna array 31 can be in electrical communication with router device 14. Antenna array 31 can include one or more cellular antennas 32, one or more wireless network (e.g. Wi-Fi®) antennas 34, and at least one global positioning system (GPS) antenna 36 secured, retained within, or attached to an inside surface 13 of case 12. In certain embodiments, antennas 32, 34, and 36 of antenna array 31 may be attached to lid inside surface 13b of lid 44, as shown in FIGS. 1 and 6. In other embodiments, as shown in FIG. 12, antenna array 31 can be secured in, retained within, or attached to base 42 of case 12. In some embodiments, each antenna 32, 34, and 36 of antenna array 31 can be separately mounted or attached within case 12, as shown in FIG. 1. In other embodiments, each of the antennas of antenna array 31 can be contained together in an antenna housing 64, and antenna housing 64 can be contained within or attached to either base 42 or lid 40 of case 12 at a single location, as shown in FIG. 12. The location of antenna array 31 inside case 12 is beneficial because conventional, portable antennas are typically located on the outside of a data communications unit, creating a cumbersome device that is unaesthetically pleasing where the antennas are freely exposed to external wear, tear and breakage. In contrast, antennas 32, 34, and 36, as well as the other electrical components of apparatus 10 are protected by case 12 when lid 44 is in the closed position, which can help prevent damage to the integral electrical and/or communication components of apparatus 10. When lid 44 is in the closed position, case 12 can enclose and protect power supply 24, router device 14, and antenna array 31, as shown in FIGS. 2 and 7.

Figure 9:
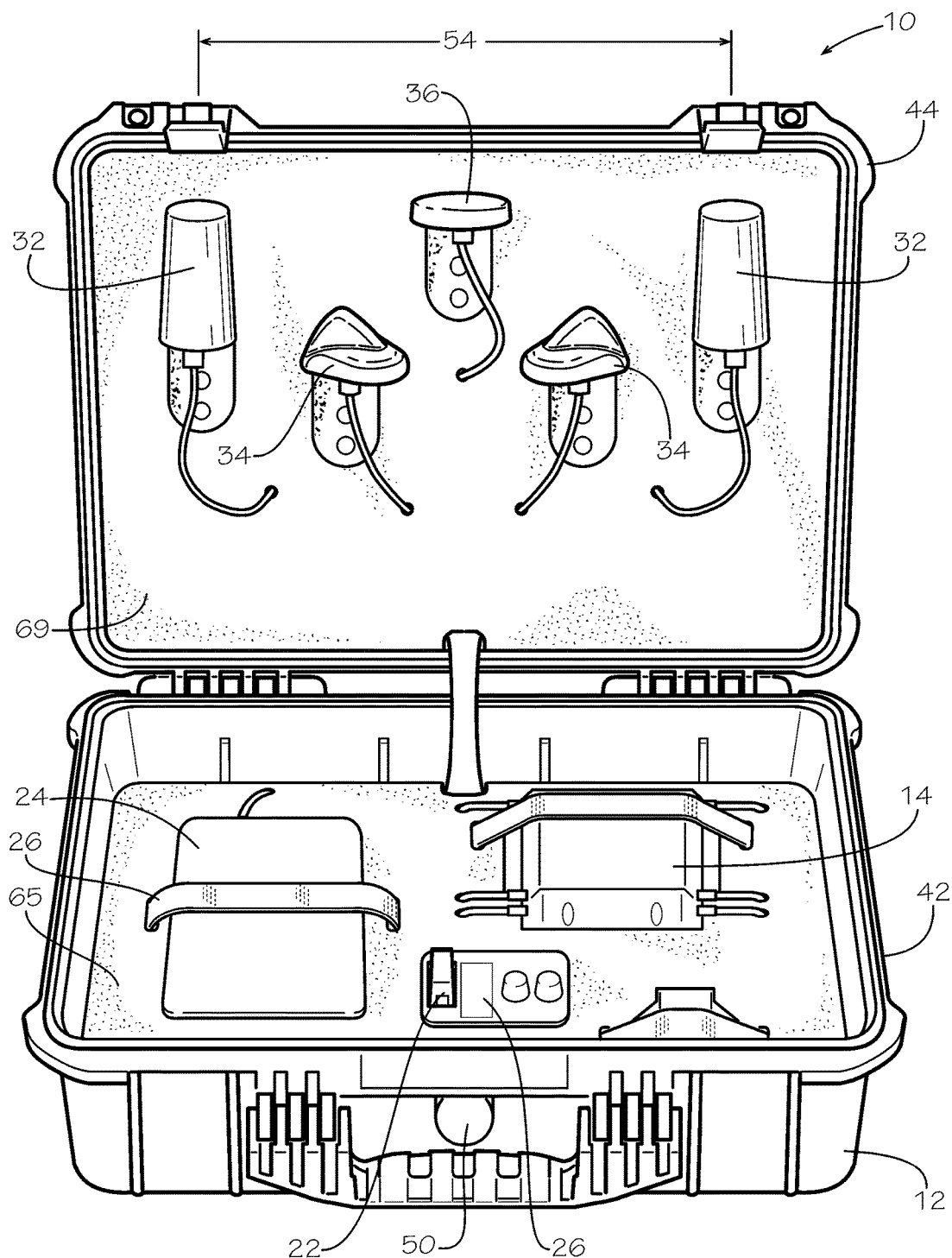
FIG. 9 is a front view of the apparatus of FIG. 1.

In the embodiment shown in FIG. 1, two cellular antennas 32 are utilized to cover frequencies across 700 and 800 MHz as well as all global cellular frequencies from 698-960 MHz and 1710-2700 MHz. Cellular antennas 32 of the embodiment in FIG. 1 may require a ground plane. For the embodiment shown in FIG. 1 and discussed above, it has been discovered that vertical polarity cellular antennas requiring a ground plane may be particularly advantageous. Ground plane independent cellular antennas and horizontal polarity cellular antennas, however, may also be used in other embodiments. Cellular antennas 32 of the embodiment in FIG. 1 may allow for multiple user and multiple-input and multiple-output (MiMo) applications. As shown in FIG. 9, cellular antennas 32 can be positioned at a cellular antenna separation distance 54 from one another within case 12 to help reduce frequency interference between cellular antennas 32. In one embodiment, cellular antenna separation distance 54 is at least 12 inches.

In certain embodiments, GPS antenna 36, as shown in FIG. 1, can be included in the data communications case. In one embodiment, the GPS antenna has an operating frequency of 1575 MHz, but many other operating frequencies may be utilized. In one embodiment, GPS antenna 36 can have a low-noise amplifier gain of 26 decibels, and an impedance of 50 ohms. A plurality of GPS antennas may be used. The GPS antenna(s) may be active or passive GPS antennas.

In certain embodiments, the wireless antennas 34, as shown in FIG. 1, have a frequency range of 2.4/5 GHz. In certain embodiments, the wireless antennas 34 enable multiple user and multiple-input and multiple-output applications. In certain embodiments, a user may be able to utilize a virtual private network (VPN) with any combination of the multiple wireless networks and/or any wired network port. In certain embodiments, more than two wireless antennas can be used to further increase the capacity of the wireless network and to further support MiMo applications.

Antenna cables 52 may connect various components inside the case 12 to the antennas 32, 34, 36. The antenna cables 52 may be channeled through a conduit 51, which allows for discrete and organized bundling of the antenna cables 52 and other cables connecting components within the case. Various components inside the case 12 may also be interconnected wirelessly. It is advantageous to utilize cables having as short as a length as possible to avoid attenuation. It is also advantageous to utilize low attenuation cables.

In certain embodiments, as shown in FIGS. 1, 3, and 6, antennas 32, 34, 36 are securely mounted within case 12 to lid inside surface 13b of lid 44. Apparatus 10 can include a plurality of mounting brackets 55 which can be adhered to lid inside surface 13b. Each antenna 32, 34, and 36 of antenna array 31 can be secured inside lid 44 to a corresponding mounting bracket 55. In some embodiments, each mounting bracket 55 can be substantially L-shaped. A first bracket portion 55a of bracket 55 can be positionable substantially parallel to lid inside surface 13b, first bracket portion 55a being adhered to lid inside surface 13b. A second bracket portion 55b can extend away from lid inside surface 13b when mounting bracket 55 is adhered to lid inside surface 13b. A corresponding antenna, shown as GPS antenna 36 (by way of example only) in FIG. 3, can be mounted to second bracket portion 55b. In one embodiment of the invention, second bracket portion 55b may be shaped and sized to serve as a ground plane for any one or more than one of the antennas of the antenna array.

In certain embodiments, as shown in FIG. 3, each mounting bracket 55 can include at least one resilient polymer stud 56 having a stud length 59. Polymer studs 56 can be adhered to an inner surface 13 of case 12, and in some embodiments to lid inner surface 13b, and to first bracket portion 55a of a corresponding mounting bracket 55 such that mounting brackets 55 are adhered to lid inner surface 13b via polymer studs 56. Particularly, one end of each stud 56 can be adhered to lid inner surface 13b, and an opposing end of each stud 56 can be attached or adhered to first portion 55a of a corresponding mounting bracket 55. In some embodiments, as shown in FIG. 3, each mounting bracket 55 can have an internal grommet or hole within the first portion 55a of mounting bracket 55 and each polymer stud 56 can have a threaded receptacle such that first portion 55a of mounting bracket 55 can be secured to polymer stud 56 by a screw, bolt, or other suitable fastener 57. In some embodiments, a washer 53 can be positioned between mounting bracket 55 and fastener 57 to help disperse the force of fastener 57 against mounting bracket 55.

In other embodiments, one end of each stud 56 can be adhered to lid inner surface 13b, and an opposing end of each stud 56 can be adhered to first portion 55a of a corresponding mounting bracket 55. In still other embodiments, each polymer stud 56 and corresponding mounting bracket 55 can be integrally formed together as one continuous or unitary piece.

In certain embodiments, studs 56 can have a circular longitudinal cross section including a diameter of at least 0.5 inches and a stud length of at least 0.5 inches. In some embodiments, studs 56 can have a diameter of about 0.825 inches and a length of about 1.25 inches. Studs 56 can therefore extend inward from lid inner surface 13b a distance of at least 0.5 inches. Studs 56 can be comprised of a resilient polymer capable of dampening shock and vibration, such as polychloroprene. In certain embodiments, each stud 56 may be secured to lid inner surface 13b of lid 44 by a structural adhesive 61, such as a structural cyanoacrylate. One example of a suitable structural cyanoacrylate adhesive is BP Blue™, which can be purchased from Tech-Bond Solutions™ of Columbus, Ohio. In certain embodiments, the opposite ends of each stud 56 can also be secured to corresponding mounting brackets 55 via a similar structural adhesive, such as the structural cyanoacrylate discussed herein. While other mechanisms may be used to secure the antennas within case 12, structurally adhering studs 56 to corresponding inner surface 13 of case 12 via structural adhesives such as structural cyanoacrylates can allow antennas 32, 34, and 36 to be secured within case 12 without having to penetrate case 12.

Referring again to FIGS. 1 and 3, mounting brackets 55 used to secure antennas 32, 34, and 36 within case 12 should be configured to allow for secure placement of antennas 32, 34, and 36 on corresponding mounting brackets 55 via suitable antenna fasteners (e.g., screws, nuts, bolts) and to provide any necessary ground plane for antennas 32, 34, and 36. Mounting brackets 55 and the fasteners used to hold antennas 32, 34, and 36 in place on corresponding mounting brackets 55 within case 12 may include powder coated steel or stainless steel.

Mounting brackets 55 can be positioned at a predetermined distance away from the inside of case 12 via polymer studs 56, in some embodiments a distance of at least 0.5 inches, such that antennas are located at a sufficient distance from lid inner surface 13b of lid 44 so that case 12 may be comfortably closed, and so that antenna array 31 may have unimpeded, open-air exposure when lid 44 is in the open position. Affixing antennas 32, 34, and 36 to mounting brackets 55 on inner surface 13 of case 12 can allow for case 12 to be waterproof and dustproof and can help reduce the problem of antennas 32, 34, and 36 being easily dislocated or knocked off a data communications unit.

Figure 8:
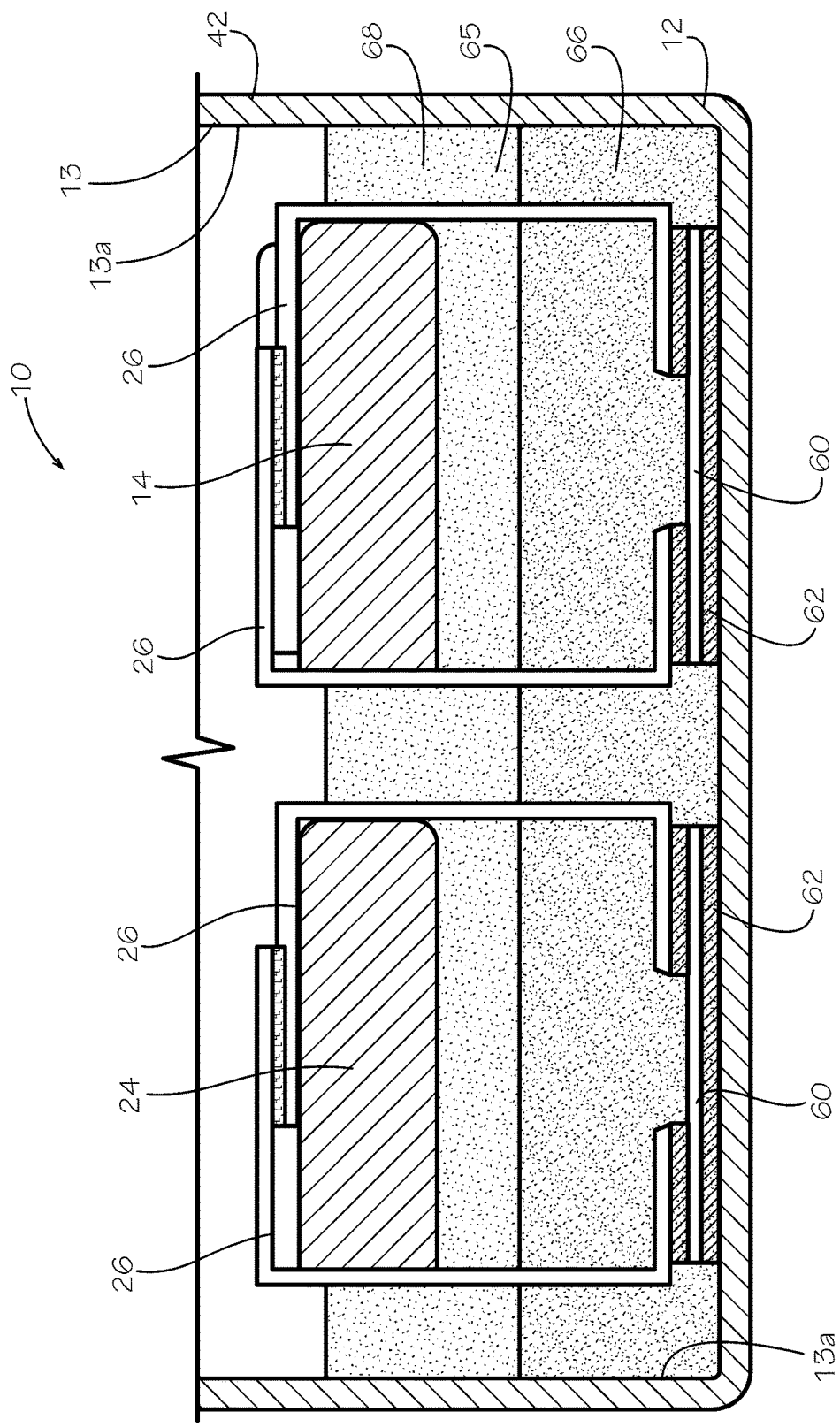
FIG. 8 is a cross section view of the base of FIG. 1 showing one or more fastening straps adhered to an inner side of the case and secured around corresponding internal components of the apparatus.

As shown in FIGS. 1 and 8, Apparatus 10 can include a plurality of fastening straps 26 adhered to case 12. Each of power supply 24, router device 14, and power switch 22 can be secured within case 12 with at least one corresponding fastening strap 26. Fastening straps 26 may incorporate hook and loop fasteners, zippers, removable adhesives, buttons, snaps, clips, or any other suitable fastening members to secure fastening straps 26 together around corresponding components of apparatus 10 to secure the components within case 12. Fastening straps 26 in some embodiments can include audible snap closures. Fastening straps 26 can be adhered or structurally bonded to either base 42 or lid 44 as desired to secure the various components of apparatus 10 to either base 42 or lid 44.

In some embodiments, fastening straps 26 may be sewn, adhered, or otherwise attached to corresponding polymer strips 60. Polymer strips 60 can be adhered to inside surface 13 of case 12 by a polymer strip structural adhesive 62 such as a structural cyanoacrylate. As such, fastening straps 26 can be adhered to case 12 via polymer strips 60. A polymer strip structural adhesive 62 including a structural cyanoacrylate can form a covalent bond between polymer strips 60 and inside surface 13 of case 12 to help provide a strong and reliable attachment of polymer strips 60 to case 12. Adhering polymer strips 60 and fastening straps 26 to case 12 can help maintain the integrity of case 12 as polymer strips 60 and fastening straps 26 are not secured to case 12 by mechanical fasteners such as screws or bolts that can penetrate case 12.

In some embodiments, fastening straps 26 may be sewn to the polymer strips 60 using sewing thread that meets or exceeds U.S. military specifications. In other embodiments, fastening straps 26 can be adhered to polymer strips 60. In still other embodiments, the fastening straps 26 may be adhered directly to inner surface 13 of case 12.

Polymer strips 60 may comprise polychloroprene, nylon-reinforced polychloroprene, or another suitable polymer. Polymer strips 60 made of nylon-reinforced polychloroprene have been found to be particularly advantageous.

In some embodiments, as shown in FIG. 1, router device 14, power supply 24, and power switch 22 can be secured in base 42 via suitable fastening strips 26, and each antenna 32, 34, and 36 of antenna array 31 can be secured within lid 44 via a corresponding mounting bracket 55. In other embodiments, as shown in FIG. 12, one or more of power supply 24 and/or router device 14 can be secured in lid 44 via fastening strips 26, and antenna array 31, positioned within antenna housing 64, can be secured within base 42 by fastening straps 26.

Referring again to FIG. 1, and also shown in FIG. 6, the communications components positioned within case 12 can be further secured and protected within case 12 by a base foam cushion 65 positioned within base 42, and a lid foam cushion 69 positioned within lid 44. Foam cushions 65 and 69 can at least partially surround or support components positioned within base 42 and lid 44 respectively. Foam cushions 65 and 69 can be oriented and shaped to allow a surface of respective components positioned in base 42 and lid 44 to be exposed when lid 44 is in the open position for ease of operation of apparatus 10, as shown in FIG. 1. In some embodiments, base foam cushion 65 and lid foam cushion 69 can each include open cell foam having a foam density greater than or equal to 2 pounds per cubic foot. In some embodiments, base foam cushion 65 and lid foam cushion 69 can each include open cell foam having a foam density greater than or equal to about 4 pounds per cubic foot.

In certain embodiments, apparatus 10 can include an additional removable cushion 75 placeable between lid 44 and base 42 when lid 44 is moved to the closed position, as shown in FIGS. 6 and 7. Removable cushion 75 can help prevent interference and damage between components positioned in base 42 and components positioned in lid 44 when lid 44 is moved to the closed position. Removable cushion 75 can generally pad the components contained in case 12 when lid 44 is in the closed position.

Each of foam cushions 65 and 69 may include multiple layers in some embodiments. In certain embodiments, at least one of the foam layers in each foam cushion 65 and 69 can have cutouts or recesses for receiving various components housed in case 12. In some embodiments, as shown in FIGS. 6 and 7, base foam cushion 65 can have a first base foam cushion layer 66 and a second base foam cushion layer 68. First base foam cushion layer 66 can be positioned between second base foam cushion layer 68 and base 42, and particularly a bottom of base 42. In some embodiments, first base foam cushion layer 66 can rest against the bottom of base 42 and second base foam cushion layer 68 can rest against first base foam cushion layer 66 and can include one or more cutouts or recesses for receiving the components positioned in base 42. In some embodiments, first base foam cushion layer 66 and second base foam cushion layer 68 can have varying foam densities, with the foam density of second base foam cushion layer 68 being greater than the foam density of first base foam cushion layer 66. For instance, first base foam cushion layer 66 in some embodiments can have a foam density between about 1 and 3 pounds per cubic foot and second base foam cushion layer 68 can have a foam density between about 3 and 5 pounds per cubic foot. In one embodiment, first base foam cushion layer 66 can have a foam density of about 2 pounds per cubic foot, and second base cushion layer 68 can have a foam density of about 4 pounds per cubic foot. Cushioning foam layers with varying densities can provide varying impact dissipation characteristics on the internal components of case 12 when case 12 is dropped from a high distance or case 12 is otherwise subjected to a large external force, to help protect the internal components housed in case 12 from damage due to the external force.

As shown in FIGS. 1 and 6, in some embodiments, the lid 44 contains a lid foam cushion 69, albeit less thick due to the difference in depth of the cavities 15a and 15b between the base 42 and lid 44, respectively, shown in FIG. 6. Lid foam cushion layer 69 can help provide added support, protection, and gravitational force deceleration for components, including antenna array 31 in some embodiments, positioned in lid 44, in the event case 12 is dropped from a high distance or exposed to external forces. Lid foam cushion 69 of lid 44 can also contain cutouts or recesses for the exposure of components positioned in lid 44 of case 12 when lid 44 is in the open position. In some embodiments, as shown in FIGS. 6-7, lid foam cushion 69 positioned in lid 44 can include a first lid foam cushion layer 70 and a second lid foam cushion layer 72. First lid foam cushion layer 70 can be positioned between second lid foam cushion layer 72 and lid 44, and particularly the top of lid 44. First lid foam cushion layer 70 can be positioned against lid 44, and second lid foam cushion layer 72 can be positioned against first lid foam cushion layer 70, the second lid foam cushion layer 72 including multiple cutouts or recesses for receiving components positioned within lid 44. In some embodiments, first and second lid foam cushion layers 70 and 72 can have varying foam densities, with second lid foam cushion layer 72 having a foam density that is greater than the foam density of first lid foam cushion layer 70. For instance, first lid foam cushion layer 70 in some embodiments can have a foam density between about 1 and 3 pounds per cubic foot and second lid foam cushion layer 72 can have a foam density between about 3 and 5 pounds per cubic foot.

Wireless power supply 24 may be used to power any component in case 12. In certain embodiments, wireless power supply 24 may be charged via AC/DC adapter 16. Wireless power supply 24 in other embodiments can also be configured to receive a charge via a solar panel charger, a cigarette lighter adapter, or various other chargers and/or adapters known in the art. Power supply 24 may have additional output ports for charging laptops, notebooks, notepads, cellular phones, etc. In certain embodiments, various adapters that allow for power to be supplied to other external components may also be housed within case 12 and connected to power supply 24.

Figure 14:
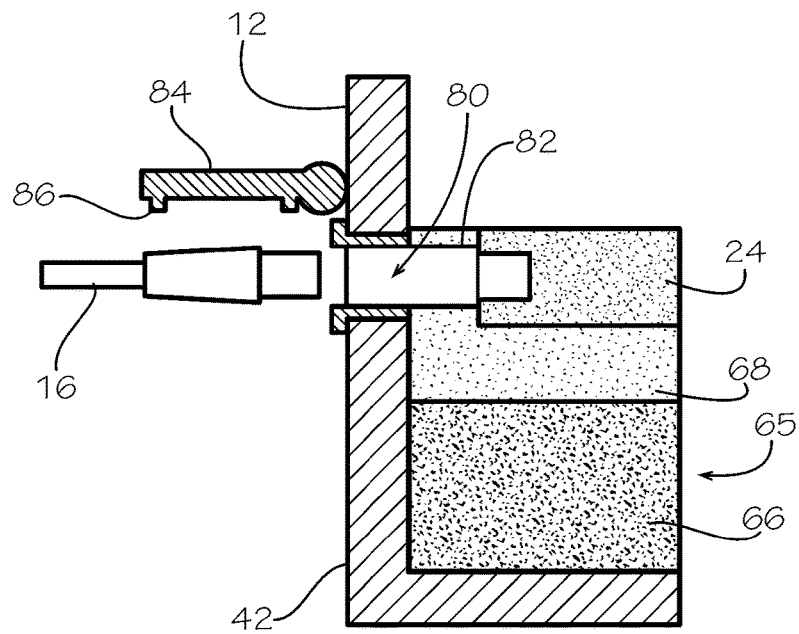
FIG. 14 is a partial cross-section view of another embodiment of a data communications apparatus of the present disclosure where a base of the case has a charging port sized to receive the plug of an adapter to recharge the power source.
Figure 15:
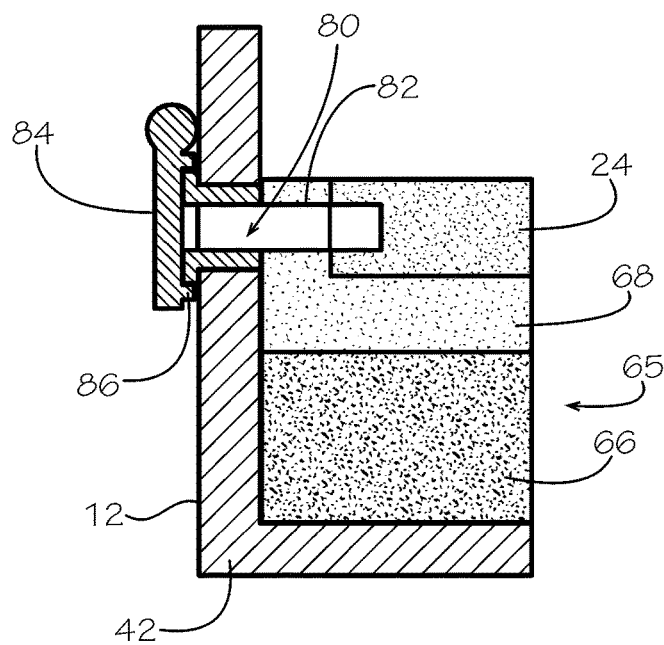
FIG. 15 is a partial cross-section view of the apparatus of FIG. 14 with a cap for the charging port in a closed position over the charging port.

In some embodiments, as shown in FIGS. 14 and 15, base 42 can include a charging port 80 defined in a side of base 42. Charging port 80 can be positioned such that a plug of AC/DC adapter can be received through charging port 80 and connected to power supply 24 positioned within case 12. By having a charging port 80 defined in base 42 which can provide access to power supply 24, case 12 can be placed in a closed position as power supply 24 and apparatus 10 are being recharged, which can help save space. In some embodiments, charging port 80 can include a smooth inner grommet which can provide a smooth internal contact surface as the plug of AC/DC adapter 16 is inserted through charging port 80, which can help prevent damage to AC/DC adapter 16.

In some embodiments, a plug access channel 82 can be defined in base foam cushion layer 65 and particularly second base foam cushion layer 68, plug access channel 82 providing access to power supply 24 from charging port 80 and through second base foam cushion layer 68. In some embodiments, apparatus 10 can include a charging port cap 84 which can be pivotally attached to an exterior of base 42. Charging port cap 84 can be rotated to an open position to provide access to charging port 80 and power supply 24. Once charging of power supply 24 is complete, charging port cap 84 can be rotated to a closed position over charging port 80 to block access to charging port 80. In some embodiments, charging port cap 84 can include an outer gasket or seal 86 which can be disposed against base 42 around charging port 80 when charging port cap 84 is in the closed position over charging port 80, gasket 86 forming a seal around charging port to help prevent liquids or other contaminates from entering case 12 via charging port 80. In some embodiments, apparatus 10 can include a releasable fastener, such as snap fit member, a hook and loop fastener, buttons, snaps, hooks, clasps, etc., which can selectively retain charging port cap 84 in the closed position over charging port 80.

Figure 10:
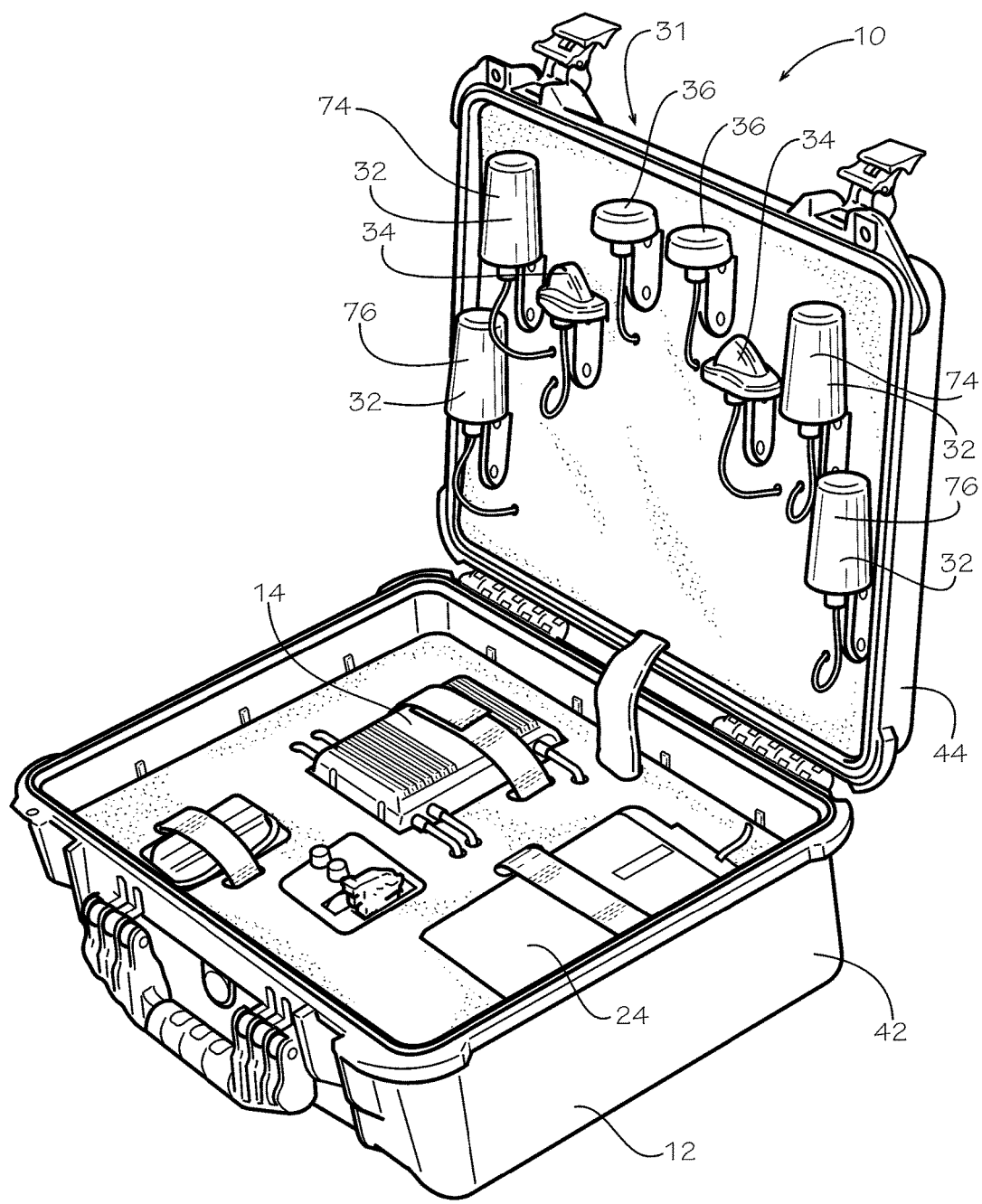
FIG. 10 is a perspective view of another embodiment of a data communications apparatus of the present disclosure having an antenna array with multiple pairs of cellular antennas.
Figure 11:
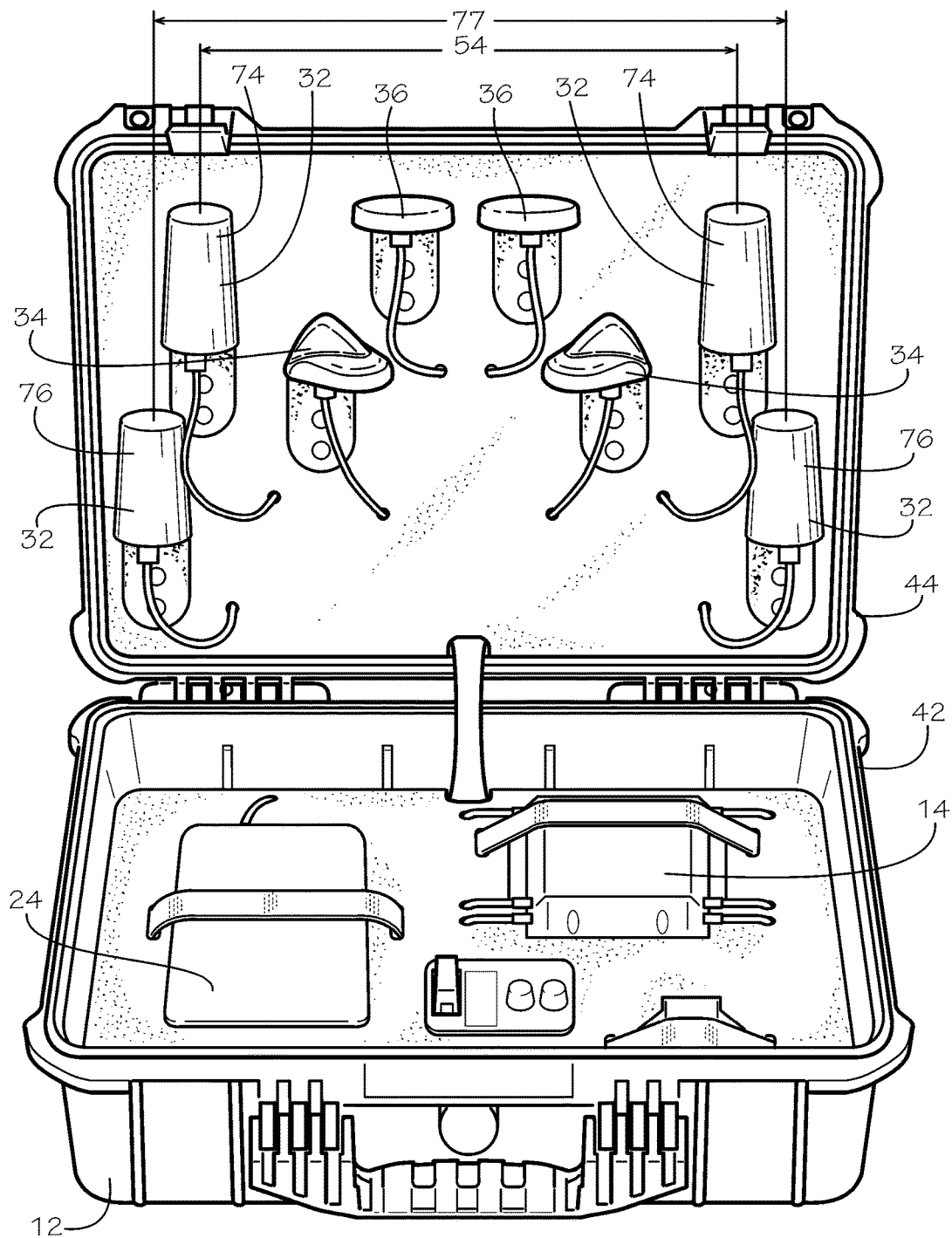
FIG. 11 is a front perspective view of the apparatus of FIG. 11.

Another embodiment of a data communications case 12, shown in FIGS. 10-11, includes an antenna array 31 having a first pair 74 of cellular antennas 32, and a second pair 76 of cellular antennas 32. In some embodiments, first pair 74 of cellular antennas 32 can be positioned at least 12 inches apart from one another within case 12, and second pair 76 of cellular antennas 32 can be positioned at least 12 inches apart from one another within case 12, which can help reduce frequency interference between cellular antennas 32. In other words, cellular antenna separation distance 54 between first pair 74 of cellular antennas 32 can be greater than or equal to about 12 inches, and second cellular antenna separation distance 77 can be greater than or equal to about 12 inches. Each pair 74 and 76 of cellular antennas 32 can be capable of sending and receiving a signal across a cellular network, such that apparatus 10 of FIGS. 10-11 when used can accommodate cellular service with two different cellular carriers.

In one embodiment shown in FIG. 12, antenna array 31 is contained in an antenna array housing 64 retained or secured to base 42 using one or more fastening straps 26. Antenna array 31 and antenna array housing 64 can also be described as being a singular antenna with multiple antenna elements. In one embodiment, the antenna housing 64 can contain five isolated high performance antenna elements, including two cellular antenna elements utilizing distinct wireless frequencies and supporting MiMo; two dual band wireless antenna elements supporting MiMo and diversity operation for WIFI and WiMax wireless networks; and one GPS antenna element. In some embodiments, the antenna elements in antenna array housing 64 can be ground plane independent such that antenna array 31 can be positioned either in lid 44 or in base 42 of case 12, and the antenna elements can maintain a generally high performance even when mounted on a non-metallic surface.

Having antenna array 31 compactly arranged within a durable case 12, and particularly within a compact antenna housing 64, as shown in FIG. 12, can help reduce the space necessary to accommodate antenna array 31 within case 12. As such, the overall size, weight, and profile of case 12 can be reduced if desired. In some embodiments, the overall size of case 12 in FIG. 12 can be about 15 inches in length by 11 inches in width. Having a smaller overall size of case 12 can further help make case 12 more convenient to transport. For instance, for a smaller office setting where less communication capabilities are needed, case 12 of FIG. 12 can easily be transported between various locations on site as desired. Additionally, hospitals having nurses moving from room to room and documenting patient status can carry a smaller case 12 with them such that they have wireless access with them at all times and can update patient records on a hospital network or system in real time as they move from patient to patient. Similarly, traveling sales forces can conveniently carry a smaller case 12 with them to remote business meetings to ensure they have wireless and cellular service. Other uses and applications of the relatively smaller case of FIG. 12 will be readily apparent to one of skill in the art.

Figure 13:
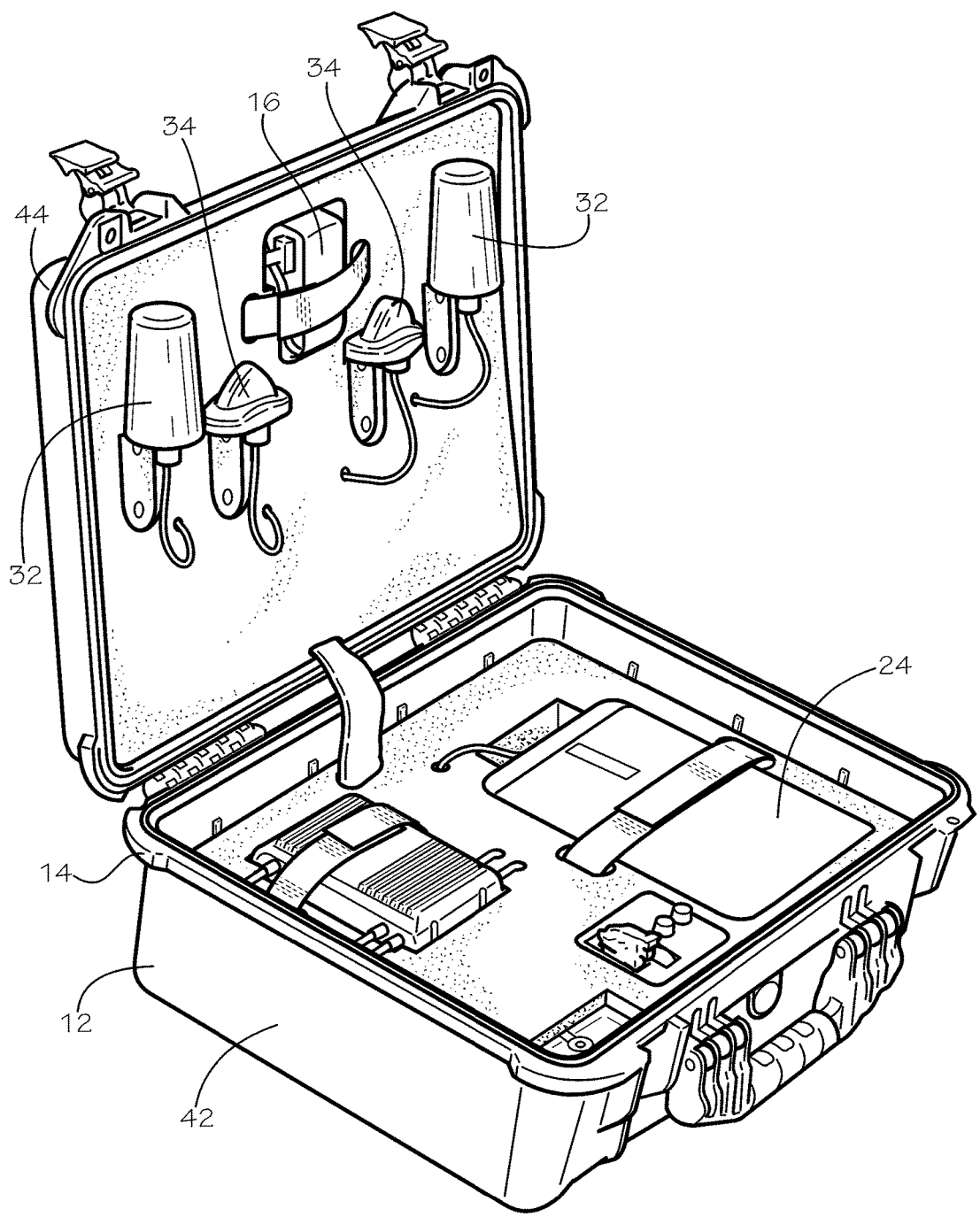
FIG. 13 is a perspective view of another embodiment of a data communications apparatus of the present disclosure.

In another embodiment, shown in FIG. 13, a GPS antenna can be removed from antenna array 31, and AC/DC adapter 16 can be positioned and retained on lid 44 such that the overall dimensions of case 12 can be reduced. AC/DC adapter 16 can generally be located in position corresponding to the location of the GPS antenna on lid 44 shown in FIG. 1.

Figure 16:
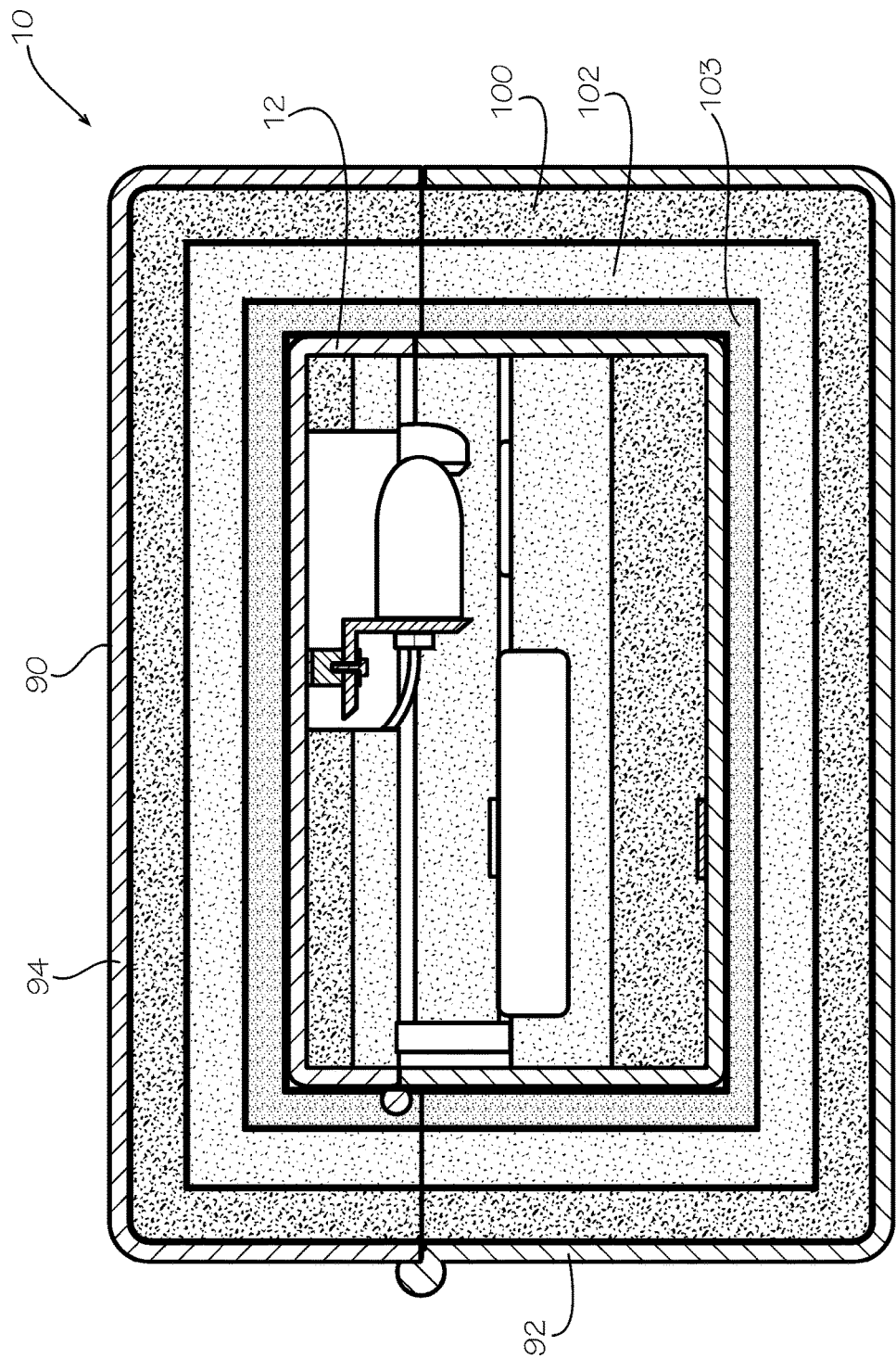
FIG. 16 is a cross-section view of another embodiment of a data communications apparatus of the present disclosure including a second outer protective case having multiple second case cushion foam layers.
Figure 17:
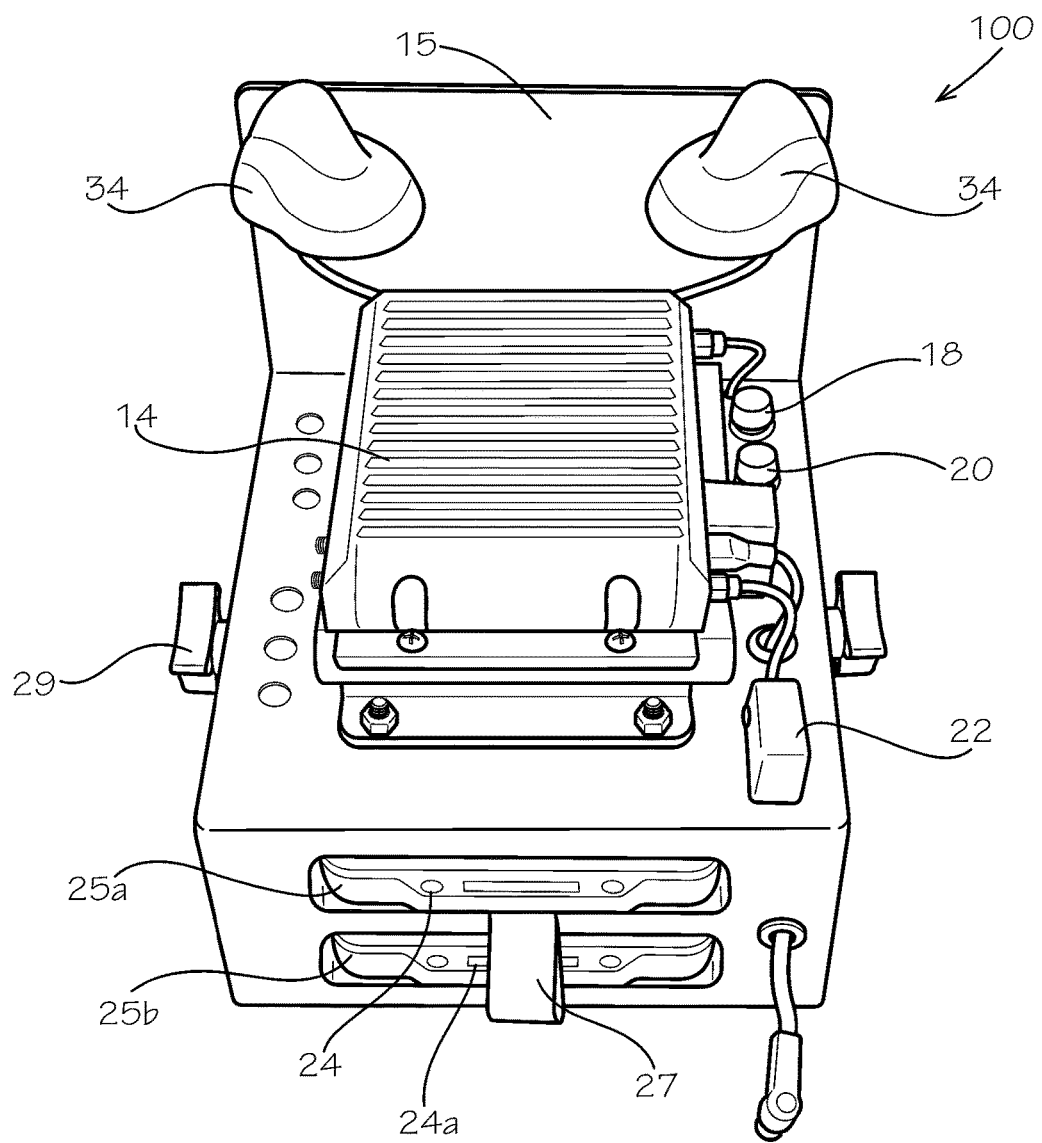
FIG. 17 is a perspective view of an embodiment of a support frame for a data communications system of the present disclosure for a vehicle.
Figure 18:
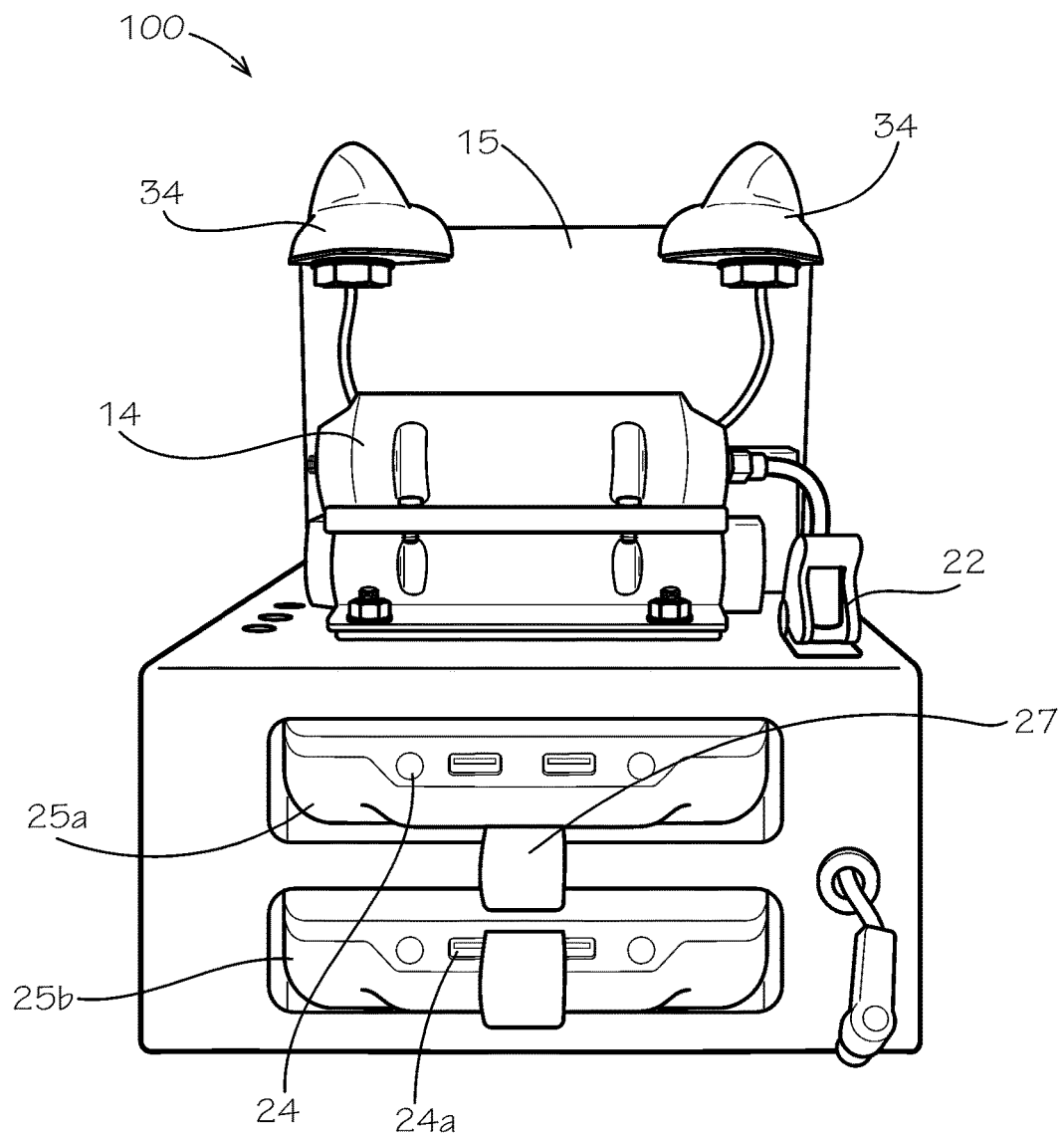
FIG. 18 is a front elevation view of the support frame of FIG. 17.
Figure 19:
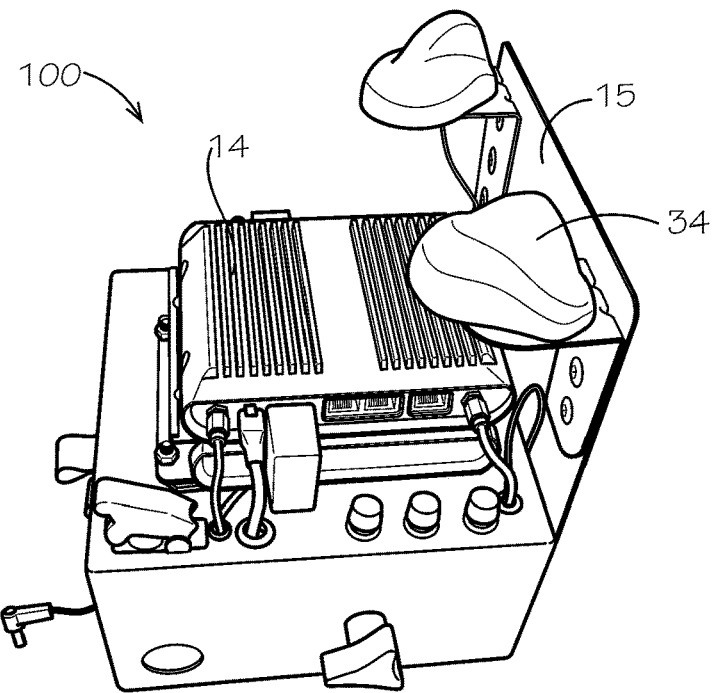
FIG. 19 is a right side view of the support frame of FIG. 17.
Figure 20:
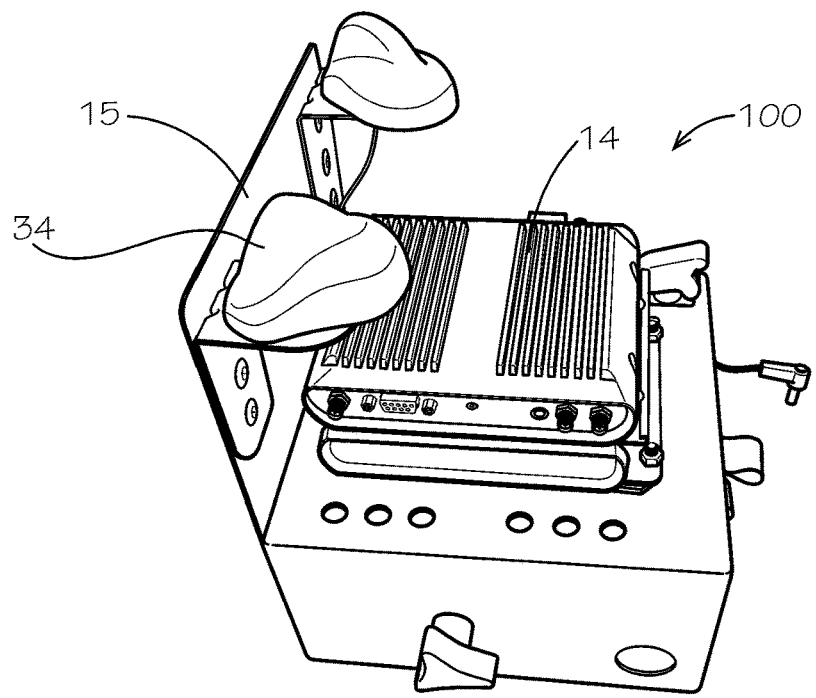
FIG. 20 is a left side view of the support frame of FIG. 17.
Figure 21:
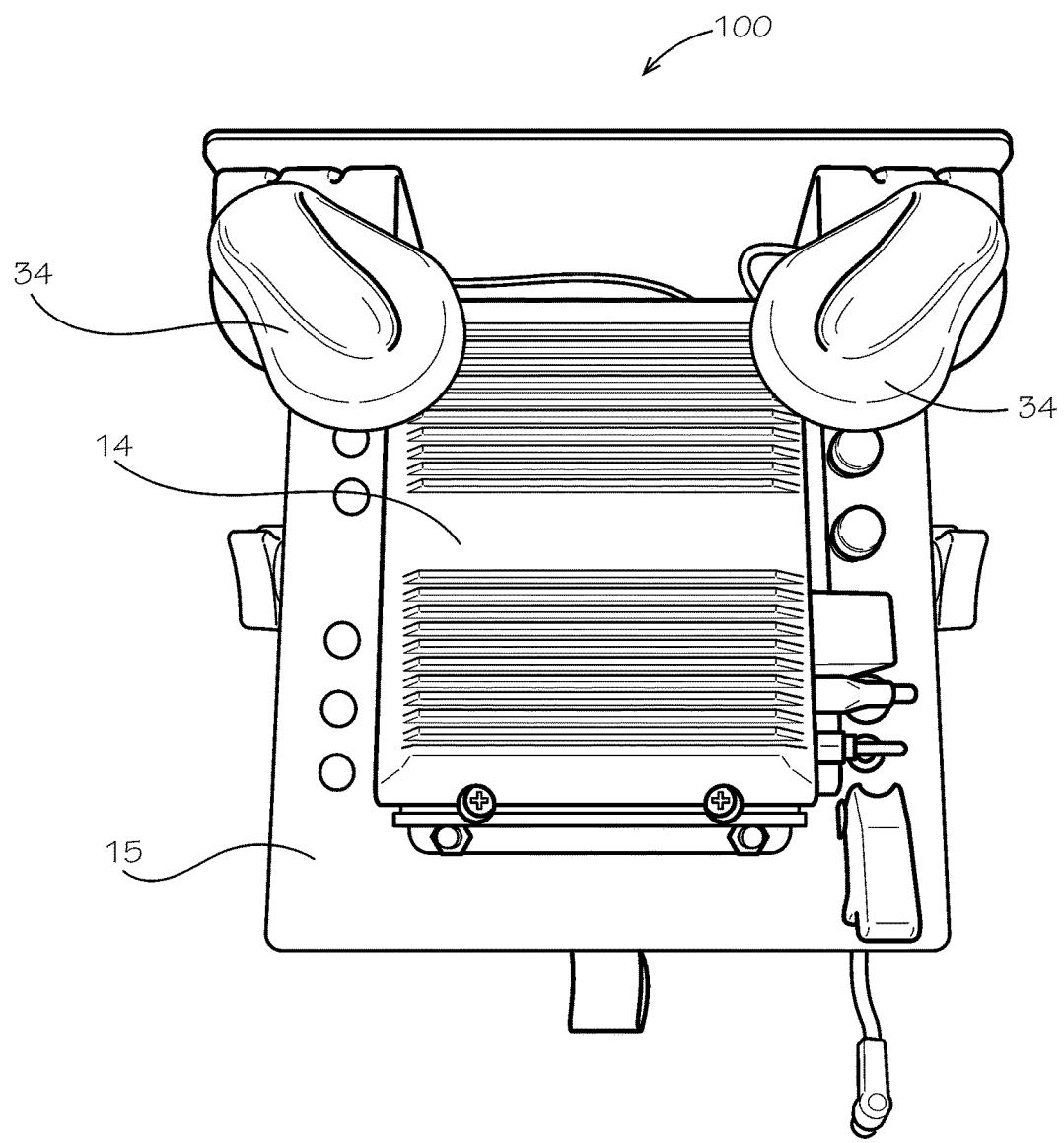
FIG. 21 is a top view of the support frame of FIG. 17.
Figure 22:
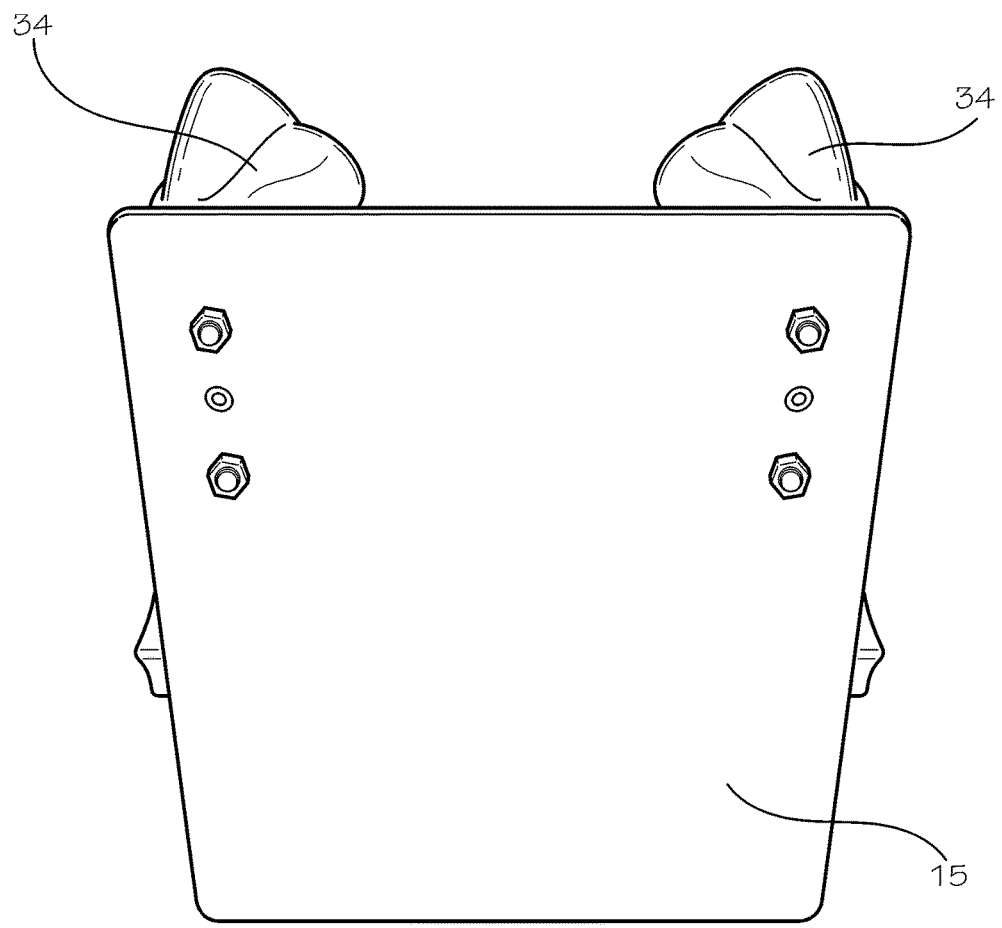
FIG. 22 is a back elevation view of the support frame of FIG. 17.
Figure 23:
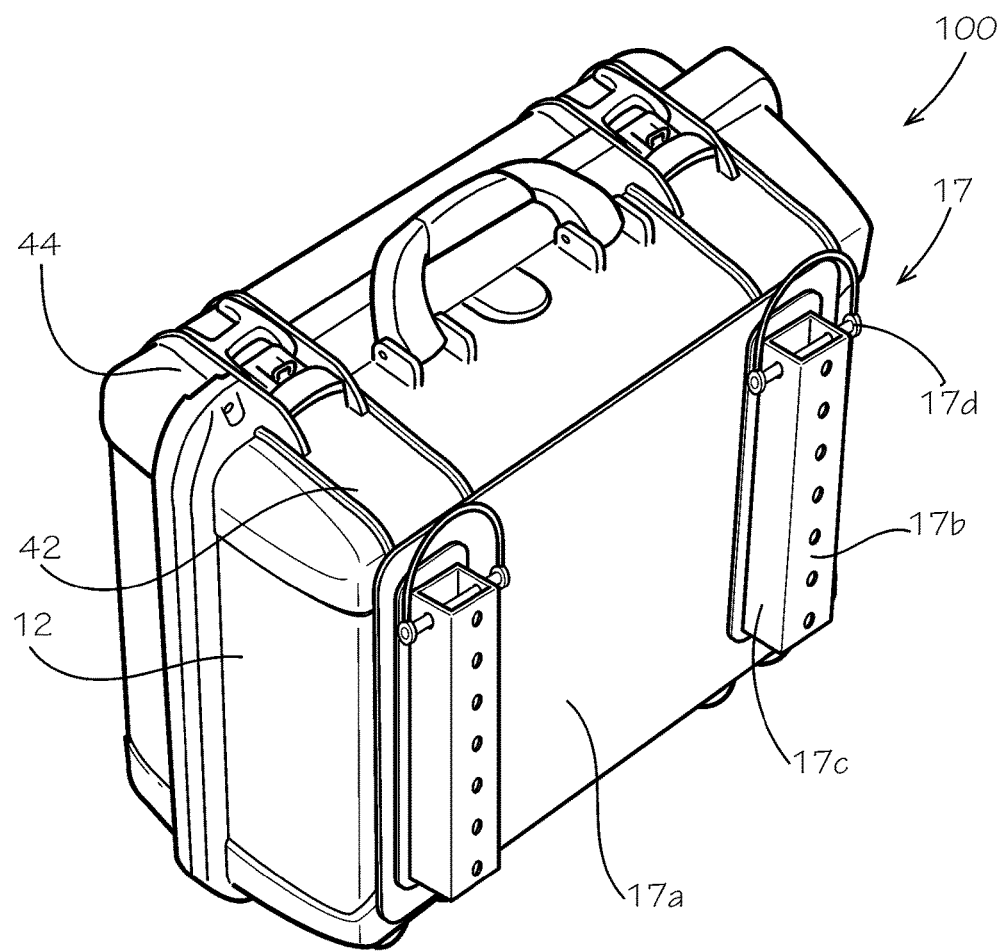
FIG. 23 is a bottom perspective view of a case for a data communications system of the present disclosure for a vehicle with a mounting system.

Another embodiment of a data communications apparatus 10 is shown in FIG. 16. In some embodiments, a second outer case 90 including a second base 92 and second lid 94 can be selectively enclosed around case 12. Second case 90 can provide an additional layer of protection for the communications components positioned within case 12. In some embodiments, one or more second case foam cushion layers can be positioned in second case 12 and can surround case 12 when second case 90 is in a closed position, as shown in FIG. 16. In some embodiments, second case 90 can include a first second case foam cushion layer 100, a second second case foam cushion layer 102, and a third second case foam cushion layer 104. In some embodiments, second case 90 can also include a pressure release valve configured to release pressure inside second case 90 if the pressure rises above a predetermined threshold.

In some embodiments, first second case foam cushion layer 100 can have a foam density that is greater than the foam density of second second case foam cushion layer 102, and second second case foam cushion layer 102 can have a foam density that is greater than the foam density of third second case foam cushion layer 104. In some embodiments, the foam density of first second case foam cushion layer 100 can be between about 3 and 5 pounds per cubic foot, the foam density of second second case foam cushion layer 102 can be between about 2 and 3 pounds per cubic foot, and the foam density of third second case foam cushion layer 102 can be between about 1 and 2 pounds per cubic foot. In some embodiments, the foam density of first second case foam cushion layer 100 can be about 4 pounds per cubic foot, the foam density of second second case foam cushion layer 102 can be about 2.8 pounds per cubic foot, and the foam density of third second case foam cushion layer 102 can be about 1.8 pounds per cubic foot. Second case foam cushion layers 100, 102, and 104 can be made from either open cell or closed cell foam materials. In some embodiments, first second case foam cushion layer 100 can be made from closed cell foam, and second and third second case foam cushion layers 102 and 104 can be made from open cell foam. While the embodiment shown in FIG. 16 shows three second case foam cushion layers, in other embodiments, varying numbers of foam cushion layers can be implemented in second case 90.

Having a second protective case 90 with foam cushion layers can provide additional protection to the communications components of case 12, which can be beneficial in emergency, military, or other situations where it may be advantageous to drop apparatus 10 from a high altitude, for instance when it is desirable to drop apparatus 10 from a helicopter. Having additional protection and foam cushion layers around the communications components of apparatus 10 can help absorb the impact as apparatus 10 is dropped from a higher altitude.

While FIGS. 1-16 show various components, including power supply 24, router device 14, antenna array 30, cellular antennas 32, wireless antennas 34, GPS antennas 36, power switch 22, adapter 16, etc., in various orientations and positions within case 12, base 42, and lid 44, each of the various components within case 12 can be positioned in either base 42 or lid 44 of case 12. In some embodiments, a portion of the antennas in antenna array 30 can be positioned within base 42, and a portion of the antennas in antenna array 44 can be positioned in lid 44. Among other reasons, it may be advantageous to position the antennas of the antenna array in various positions within the case when using different size cases, due to varying numbers of different types of antennas used, or to shorten cable length between the antennas and the router device.

Another aspect of the present disclosure, shown in FIGS. 17-26, is a data communications system 100 for a vehicle 92 having an interior space 92*a* and an exterior surface 92*b*. A support frame or housing 15 can be configured to mount inside the vehicle 92 or in the interior space 92*a* of the vehicle 92. In some embodiments, a support frame 15 can be configured to mount to a dashboard, door, floorboard, or other portion of the vehicle chassis inside the vehicle. The support frame 15 can be made from any number of suitable materials including but not limited to aluminum or steel and including aramid or para-aramid synthetic fibers, such as Kevlar. One or more components of the communications system 100 can be positioned on the support frame 15. For instance in some embodiments, one or more of the router device 14, the power switch 22, the main and auxiliary fuses 18 and 20, the power supply 24, and/or the wireless antennas 34 can be mounted on the frame 15. As such, the control for the communications system 10 can be positioned in the interior of the vehicle and be accessible by a passenger or driver of the vehicle.

In some embodiments, router device 14 can be a dual modem capable router device, such that router device 14 can be utilized with two modems to create multiple wireless networks. The router device may include a Gobi-enabled chipset. In some embodiments, router device 14 can have a built in modem, and support frame 15 can be configured to hold a second modem either above or below router device 14 which can be connected to router device 14 to enable multiple wireless networks. Wireless antennas 34 in some embodiments can be mounted to the support frame 15 and connected to router device 14 to send and receive wireless communications.

In some embodiments, the support frame 15 can have a first power supply slot 25*a* and a second power supply slot 25*b* defined in the front surface of the support frame 15. The communications system can include first and second power supplies 24 and 24*a,* each power supply slot 25*a* and 25*b* being sized to receive a corresponding power supply 24 and 24*a,* respectively, in the support frame 15. The power supplies 24 and 24*a* can be retained within slots 25*a* and 25*b* respectively by one or more retention members. In some embodiments, the retention members can be adjustable straps 27 and/or one or more adjustable clamps 29 which can be adjusted by the user to selectively secure or release the power supplies 24 and 24*a* from slots 25*a* and 25*b* respectively. Straps 27 and clamps 29 can help prevent power supplies 24 and 24*a* from sliding out of slots 25*a* and 25*b* respectively during movement, acceleration, and braking of the vehicle.

Case 12 of the data communications system 100 shown in FIGS. 23-26 can be configured to be mounted to an exterior surface 92*b* of the vehicle 92. In some embodiments, the case 12 can be configured to be mounted to a top, side, front, or exterior bed of the vehicle 92. In some embodiments, the case 12 can include a mounting system 17 which can mount the case 12 to the vehicle 92. In some embodiments, the mounting system 17 can include a support plate 17a secured to a bottom or top of the case 12. In some embodiments, the support plate 17 can be adhered, welded, or otherwise secured to the case 12 such that the integrity of the case is not compromised with holes or other perforations. Thus in some embodiments the components of the mounting system 17 can be connected or mounted to support plate 17a as opposed to case 12. The support plate 17a can be comprised of a number of suitable materials, including the same materials that comprise support frame 15.

One or more case rails 17b can be secured or mounted to the plate 17a on the case 12. In other embodiments, the case rails 17b can be mounted, welded, or adhered directly to the case 12. Corresponding vehicle rails 17c can be secured or mounted to the exterior surface of the vehicle 92. Once vehicle rails 17c are mounted to the vehicle via one or more bolts, screws, tap screws, magnets, welds, etc., case 12 can be received onto vehicle rails 17c via case rails 17b. Each of case rails 17b and vehicle rails 17c can include one or more flanges with corresponding holes. Holes on the flanges of case rails 17b can be aligned with corresponding holes on the flanges of vehicle rails 17c, and a securement pin 17d can be inserted through the holes to secure case rails 17b to vehicle rails 17c. In some embodiments, the position of case 12 on vehicle rails 17c can be adjustable. When the securement pin 17d is removed, case 12 can be slid off of vehicle rails 17c such that case 12 can be selectively removed from the vehicle.

In other embodiments, the mounting system 17 can be any suitable structure for securing or mounting the case 12 to the vehicle 92, including but not limited to, removable bolts, screws, fasteners, adhesives, snapfit or interference fasteners, etc. The mounting system 17 can allow the case to be removed from the vehicle 92 such that case 12 and other components of the data communications system 100 (i.e. the support frame 15 and related components) can be taken with the user once the user has reached a desired destination in the vehicle for continued use of the data communications equipment.

Figure 24:
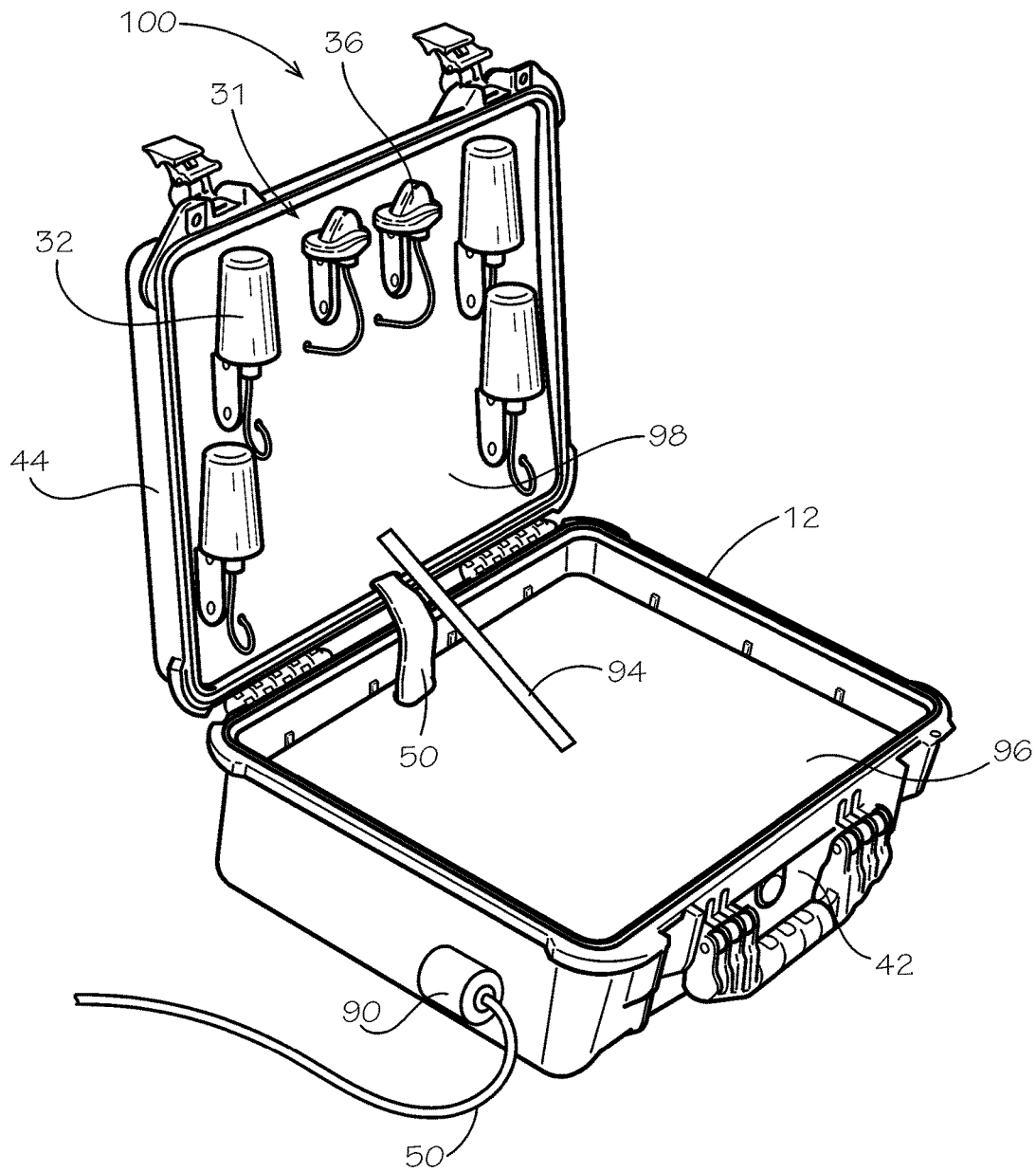
FIG. 24 is a perspective view of the case of FIG. 23 in an open position.

An array of cellular antennas 31 can be mounted inside the case 12. The antenna array 31 can include two or more cellular antennas 32 and at least one gps antenna 36. In some embodiments, as shown in FIG. 24, the antenna array 31 can include four cellular antennas 32, or two pairs of cellular antennas, and two gps antennas 36. With two pairs of cellular antennas 32 in the antenna array 31, the data communications system can support cellular service across two cellular networks. Each antenna of the antenna array 31 can be molecularly bonded to the case 12 via mounting brackets and a structural adhesive as previously described herein, such that when case 12 is closed the case 12 can be substantially liquid and dust proof. Antennas of the antenna array 31 can be connected within the case 12 either to the base 42 or the lid 40 of the case 12.

Antennas in the antenna array 31 within the case 12 can be electrically connected to the components inside the vehicle via electrical conduits or cables 50. A conduit port 90 can be positioned on a side of the case 12 and electrical conduits 50 can extend from the antenna array 31 through the conduit port 90 and into the vehicle to connect to other components of the communications system positioned on the support frame 15 inside the vehicle. The electrical conduits or cables 50 in some embodiments can be extended or run through a window of the vehicle and be secured along the chassis of the vehicle to retain the conduits 50 out of the area occupied by the passengers or drivers of the vehicle. In other embodiments, a conduit hole can be formed through the chassis or frame of the vehicle, and the electrical conduit 50 of the communications system can be run through the conduit hole in the vehicle.

Figure 25:
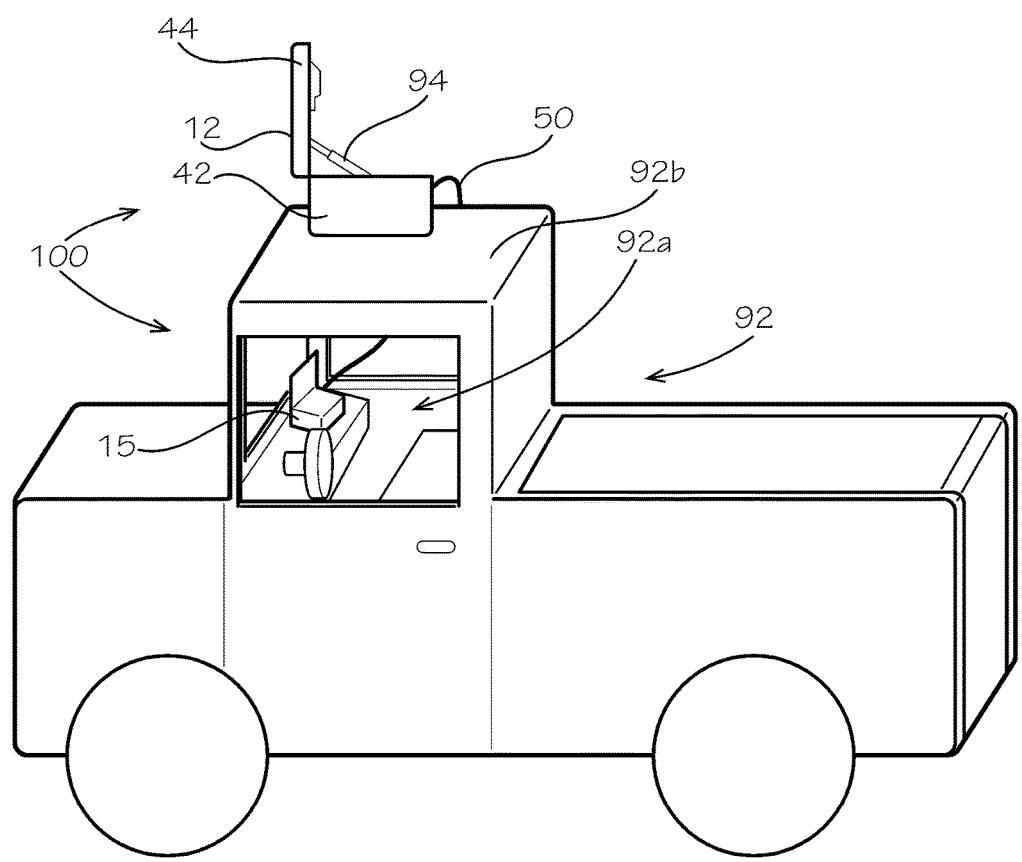
FIG. 25 is a side perspective view of the support frame of FIG. 17 and the case of FIG. 23 mounted to a vehicle.
Figure 26:
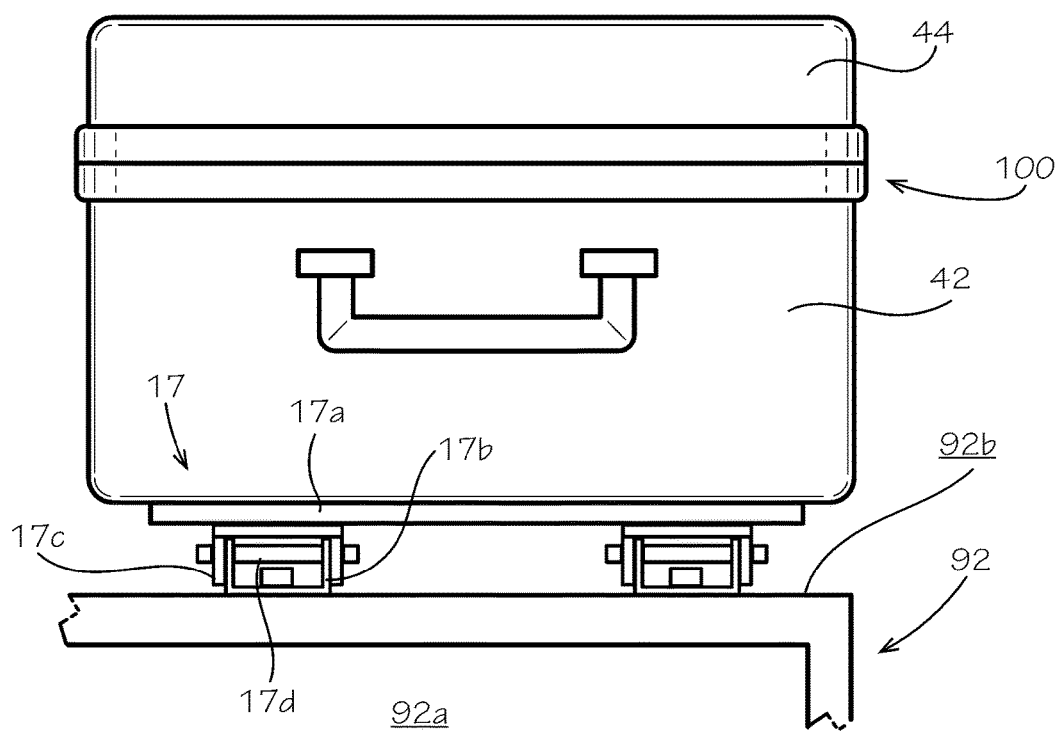
FIG. 26 is a side view of the case of FIG. 23 mounted to a vehicle via the mounting system.

As can be seen from FIGS. 25-26, the case 12 and associated components can be mounted to an exterior surface 92a of the vehicle 92, and the support frame 15 and associated components can be mounted within the interior space 92b of the vehicle 92, the support frame 15 shown mounted to a dashboard of the vehicle 92 in FIG. 25. Electrical conduits or cables 50 run between the case 12 and the support frame 15 to electrically connect the components of the data communications system 100. In other embodiments, components on the support frame 15 and components within the case 12 can be communicated wirelessly.

In some embodiments, as shown in FIGS. 24, the case 12 can include a support structure 94 which can be connected between the lid 40 and the base 42 of the case. The support structure 94 can be expandable and collapsible, the support structure 94 expanding when the lid 40 is opened, and collapsing when the lid 40 is closed. In some embodiments, the support structure 94 can be a plurality of support members pivotally connected together which can achieve a substantially straightened orientation when the lid is opened and the support members are expanded. The support members in some embodiments can be locked in the straight or expanded position as desired by the user. Such an orientation can prevent lid 40 from closing, for instance due to a wind or other external force acting upon the lid 40, such as when the vehicle is moving.

In other embodiments, as shown in FIG. 24, the support structure 94 can include a hydraulic or pneumatic piston system. Hydraulic or pneumatic pressure within the piston system can resist closure of the lid system, or bias the lid towards the open position. The piston system can be designed such that when forces such as wind resistance are applied to the lid, the lid remains in the open position. The resistance can be overcome by a manual force from the user to move the lid to the closed position, where the case 12 can be locked in the closed position. In other embodiments, the pressure within the piston system can be selectively released when the lid 40 is to be closed.

In some embodiments, the support structure 94 may include an actuator that is controllable remotely, such as from within the vehicle, so that the case could be opened and closed remotely. In some embodiments the actuator can be a motor or other mechanical device for moving components of the support structure, such as pivoting support members. In other embodiments, the actuator can be a hydraulic or pneumatic pump and control system for selectively providing and releasing pneumatic or hydraulic pressure within a piston to selectively open and close the lid 44 on the case 12.

In some embodiments, the case 12 can include a rigid base liner 96 and rigid lid liner 98, as shown in FIG. 24. The rigid base liner 96 and rigid lid liner 98 can be connected to the base 42 and lid 44 respectively, and the antenna array 31 and/or support structure 94 can be connected to one or more of the rigid base liner 96 and the rigid lid liner 98. The rigid base liner 96 and rigid lid liner 98 can provide structural support for the internal components of the case, and can be made from any suitable rigid material such as plastic, composite, metal, wood, etc.

Data communications systems 100 such as those shown in FIGS. 17-26 can be used in a variety of vehicles, including military and emergency services vehicles, such as armored cars, military transport and attack vehicles, mobile emergency vehicles such as ambulances, police cars, and firetrucks, as well as other suitable civilian vehicles.

It is contemplated that the size, shape, and configuration of the data communications case and its various components discussed herein may widely vary. Thus, although there have been described particular embodiments of the present invention of a new and useful DATA COMMUNICATIONS SYSTEM FOR A VEHICLE, it is not intended that such references be construed as limitations upon the scope of this invention.

What is claimed is:

1. A data communications system for a vehicle having an exterior surface and an interior space, the data communications system comprising:
    a support frame positionable within the interior space of the vehicle;
    a case movable between an open and a closed position, the case mountable to the exterior surface of the vehicle;
    a power supply positioned on the support frame;
    a power supply slot defined in the support frame, the power supply slot sized to receive the power supply
    a router device connected to the support frame and electrically communicated with the power supply;
    an antenna array mounted within the case, the antenna array communicated with the router device, the antenna array including at least two cellular antennas;
    a second power supply electrically communicated with the router device; and
    a second power supply slot defined in the support frame, the second power supply slot sized to receive the second power supply.

2. The data communications system of claim 1, further comprising at least one wireless networking antenna mounted to the support frame and electrically communicated with the router device.

3. The data communications system of claim 1, wherein the antenna array further comprises at least one GPS antenna mounted within the case.

4. The data communications system of claim 1, further comprising a power switch mounted to the support frame and electrically communicated with the power supply.

5. The data communications system of claim 1, further comprising a retention member disposed on the support frame, the retention member selectively retaining the power supply within the power supply slot.

6. The data communications system of claim 5, wherein the retention member is an adjustable strap.

7. The data communications system of claim 1, wherein the case further comprises a mounting system, the case mountable to the exterior surface of the vehicle via the mounting system.

8. The data communications system of claim 7, wherein the mounting system further comprises:
    a case rail mounted to the case;
    a vehicle rail mountable to the exterior surface of the vehicle; and
    a securement pin extendable through the case rail and the vehicle rail to mount the case to the exterior surface of the vehicle when the vehicle rail is mounted to the exterior surface of the vehicle.

9. The data communications system of claim 8, further comprising:
    a support plate adhered or welded to the bottom of the case;
    wherein the case rail is mounted to the case via the support plate.

10. The data communications system of claim 8, wherein the securement pin is removable from the case rail and the vehicle rail to remove the case from the vehicle.

11. The data communications system of claim 1, further comprising a support structure coupled between the lid and the base of the case, wherein the support system selectively maintains the case in the open position.

12. The data communications system of claim 11, wherein the support structure includes a hydraulic or pneumatic piston unit.

13. A data communications system for a vehicle having an exterior surface and an interior space, the data communications system comprising:
    a support frame positionable within the interior space of the vehicle;
    a case movable between an open and a closed position, the case mountable to the exterior surface of the vehicle;
    a power supply positioned on the support frame;
    a router device connected to the support frame and electrically communicated with the power supply;
    at least one wireless networking antenna mounted to the support frame and electrically communicated with the router device;
    an antenna array mounted within the case, the antenna array communicated with the router device, the antenna array including at least two cellular antennas and at least one GPS antenna; and
    a mounting system, the case mountable to the exterior surface of the vehicle via the mounting system, the mounting system including:
    a case rail mounted to the case;
    a vehicle rail mountable to the exterior surface of the vehicle; and
    a securement pin extendable through the case rail and the vehicle rail to mount the case to the exterior surface of the vehicle when the vehicle rail is mounted to the exterior surface of the vehicle.

14. The data communications system of claim 13, wherein the mounting system further comprises:
    a support plate secured to the case,
    the case rail mounted to the case via the support plate.

15. A data communications system for a vehicle having an exterior surface and an interior space, the data communications system comprising:
    a support frame positionable within the interior space of the vehicle;
    a case movable between an open and a closed position, the case including a mounting system, the case mountable to the exterior surface of the vehicle via the mounting system, the mounting system further comprising:
    a case rail mounted to the case;
    a vehicle rail mountable to the exterior surface of the vehicle; and
    a securement pin extendable through the case rail and the vehicle rail to mount the case to the exterior surface of the vehicle when the vehicle rail is mounted to the exterior surface of the vehicle;
    a power supply;
    a router device communicated with the power supply; and
    an antenna array mounted within the case, the antenna array communicated with the router device, the antenna array including at least two cellular antennas;
    wherein the power supply and/or the router device are positioned on the support frame.

16. The data communications system of claim 15, wherein the router device is mounted to the support frame, and the apparatus further comprises at least one wireless networking antenna mounted to the support frame and electrically communicated with the router device.

* * * * *